US011158687B2

(12) United States Patent
Choi et al.

(10) Patent No.: US 11,158,687 B2
(45) Date of Patent: Oct. 26, 2021

(54) ORGANIC LIGHT EMITTING DISPLAY DEVICE

(71) Applicant: SAMSUNG DISPLAY CO., LTD., Yongin-si (KR)

(72) Inventors: Yoonsun Choi, Yongin-si (KR); Wonsuk Choi, Yongin-si (KR); Sang Hyun Jun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/700,199

(22) Filed: Dec. 2, 2019

(65) Prior Publication Data
US 2020/0176529 A1    Jun. 4, 2020

(30) Foreign Application Priority Data
Dec. 3, 2018 (KR) .......................... 10-2018-0153568

(51) Int. Cl.
*H01L 27/32* (2006.01)
*H01L 51/00* (2006.01)
*H01L 51/52* (2006.01)

(52) U.S. Cl.
CPC ........ *H01L 27/3234* (2013.01); *H01L 27/323* (2013.01); *H01L 27/3276* (2013.01); *H01L 51/0097* (2013.01); *H01L 51/5253* (2013.01)

(58) Field of Classification Search
CPC ............. H01L 27/3234; H01L 27/3276; H01L 27/3244
See application file for complete search history.

(56) References Cited

U.S. PATENT DOCUMENTS

| 2017/0148856 | A1  | 5/2017  | Choi et al. |
| 2017/0288004 | A1  | 10/2017 | Kim et al. |
| 2017/0324058 | A1  | 11/2017 | Min |
| 2018/0092225 | A1  | 3/2018  | Park et al. |
| 2018/0183015 | A1* | 6/2018  | Yun ...................... H01L 27/3246 |
| 2019/0074479 | A1* | 3/2019  | Lee .......................... H01L 51/56 |
| 2019/0129552 | A1* | 5/2019  | Lee ........................ G06F 3/0443 |
| 2019/0148672 | A1* | 5/2019  | Seo ...................... H01L 51/5237 257/40 |

(Continued)

FOREIGN PATENT DOCUMENTS

| EP | 3 176 771 | 6/2017 |
| KR | 10-2016-0017845 A | 2/2016 |

OTHER PUBLICATIONS

Extended European Search Report corresponding to European Patent Application No. 19212966.6 dated Mar. 10, 2020.

*Primary Examiner* — Michele Fan
(74) *Attorney, Agent, or Firm* — Kile Park Reed & Houtteman PLLC

(57) ABSTRACT

An organic light emitting display device includes a substrate, a light emitting structure, a first conductive pattern, and a functional module. The substrate has an opening region, a peripheral region surrounding the opening region, and a display region surrounding the peripheral region, and includes a first groove, which has an enlarged lower portion, formed in the peripheral region and an opening formed in the opening region. The light emitting structure is in the display region on the substrate. The first conductive pattern overlaps the first groove in the peripheral region on the substrate. The functional module is in the opening of the substrate.

26 Claims, 24 Drawing Sheets

(56) References Cited

U.S. PATENT DOCUMENTS

| | | | |
|---|---|---|---|
| 2020/0075692 A1* | 3/2020 | Park | H01L 27/3211 |
| 2020/0144535 A1* | 5/2020 | Kim | H01L 51/5256 |
| 2020/0176520 A1* | 6/2020 | Kim | H01L 51/5246 |
| 2020/0194714 A1* | 6/2020 | Won | H01L 27/3225 |
| 2020/0194721 A1* | 6/2020 | Lee | H01L 51/5246 |
| 2020/0212140 A1* | 7/2020 | Huh | H01L 27/326 |
| 2020/0212147 A1* | 7/2020 | Han | H01L 51/5253 |
| 2020/0212159 A1* | 7/2020 | Lee | H01L 51/5246 |

\* cited by examiner

ORGANIC LIGHT EMITTING DISPLAY DEVICE

CROSS-REFERENCE TO RELATED APPLICATION

Korean Patent Application No. 10-2018-0153568, filed on Dec. 3, 2018, in the Korean Intellectual Property Office, and entitled: "Organic Light Emitting Display Device," is incorporated by reference herein in its entirety.

BACKGROUND

1. Field

Example embodiments relate generally to an organic light emitting display device.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting display ("OLED") device.

SUMMARY

Embodiments are directed to an organic light emitting display device including a substrate, a light emitting structure, a first conductive pattern, and a functional module. The substrate has an opening region, a peripheral region surrounding the opening region, and a display region surrounding the peripheral region, and includes a first groove, which has an enlarged lower portion, formed in the peripheral region and an opening formed in the opening region. The light emitting structure is in the display region on the substrate. The first conductive pattern overlaps the first groove in the peripheral region on the substrate. The functional module is in the opening of the substrate.

In an example embodiment, the first conductive pattern may include a first sub-conductive pattern and second sub-conductive patterns. The first sub-conductive pattern may overlap the first groove, and may have a plan shape of a partially opened circle including an open portion. The second sub-conductive patterns may extend from the open portion of the first sub-conductive pattern in an outward direction.

In an example embodiment, the OLED device may further include pad electrodes and signal wirings. The pad electrodes may be on the substrate, and may be electrically connected to an external device. The signal wirings, which are located on the substrate, may be disposed along an outer portion of the substrate, and may electrically connect the second sub-conductive patterns and the pad electrodes.

In an example embodiment, the first groove may surround the opening on the substrate.

In an example embodiment, the first groove may have a plan shape of a circle.

In an example embodiment, the first conductive pattern, which is located on the first groove, may be disposed along a profile of an outer portion of the first groove.

In an example embodiment, the substrate may include a first organic film layer, a first barrier layer, a second organic film layer, and a second barrier layer. The first barrier layer may be on the first organic film layer. The second organic film layer may be on the first barrier layer, and may have a trench in the peripheral region. The second barrier layer may be on the second organic film layer, and the second barrier layer, which is located on the trench, may have a protruded portion that protrudes in an inner portion of the trench. The second barrier layer may have an opening defined by the protruded portion.

In an example embodiment, the first conductive pattern may overlap the protruded portion of the second barrier layer.

In an example embodiment, the protruded portion of the second barrier layer may include a first protruded portion and a second protruded portion. The first protruded portion may be located adjacent to the opening of the substrate. The second protruded portion may face the first protruded portion, and may be spaced apart from the first protruded portion in a direction from the opening region into the peripheral region.

In an example embodiment, the OLED device may further include a second conductive pattern, which is on the first protruded portion, overlapping the first protruded portion. The first conductive pattern may be overlapped on the second protruded portion.

In an example embodiment, the first conductive pattern and the second conductive pattern may be connected to each other in a region of the peripheral region, and may be integrally formed.

In an example embodiment, the trench of the second organic film layer, the protruded portion of the second barrier layer, and the opening of the second barrier layer may be defined as the first groove, which has the enlarged lower portion, of the substrate.

In an example embodiment, the light emitting structure may include a lower electrode, a light emitting layer on the lower electrode, and an upper electrode on the light emitting layer.

In an example embodiment, the light emitting layer may extend in a direction from the display region into the peripheral region on the substrate, and may be separated in a portion where the first groove is formed.

In an example embodiment, the upper electrode may extend in a direction from the display region into the peripheral region on the substrate, and may be separated in a portion where the first groove is formed.

In an example embodiment, the light emitting layer and the upper electrode may be in at least a portion of an inner portion of the first groove.

In an example embodiment, the OLED device may further include a thin film encapsulation structure on the light emitting structure and a touch screen structure in the display region on the thin film encapsulation structure.

In an example embodiment, the thin film encapsulation structure may include a first thin film encapsulation layer, a second thin film encapsulation layer, and a third thin film encapsulation layer. The first thin film encapsulation layer may be on the upper electrode, and may include inorganic materials that have flexibility. The second thin film encapsulation layer may be on the first thin film encapsulation layer, and may include organic materials that have flexibility. The third thin film encapsulation layer may be on the second thin film encapsulation layer, and may include inorganic materials that have flexibility.

In an example embodiment, each of the first thin film encapsulation layer and the third thin film encapsulation layer may extend in a direction from the display region into the peripheral region on the upper electrode, and may be continuously disposed in a portion where the first groove is formed.

In an example embodiment, the touch screen structure may include a first insulation layer in the display region on the third thin film encapsulation layer, a touch screen electrode on the first insulation layer, a second insulation layer on the touch screen electrode, a touch screen connection electrode on the second insulation layer, and a protective insulation layer on the touch screen connection electrode.

In an example embodiment, the first insulation layer may extend in a direction from the display region into the peripheral region on the third thin film encapsulation layer, and may be continuously disposed in a portion where the first groove is formed.

In an example embodiment, the OLED device may further include an organic insulation pattern in peripheral region on the first insulation layer.

In an example embodiment, the second insulation layer may be in contact with an upper surface of the first insulation layer in the display region, and may be in contact with an upper surface of the organic insulation pattern in the peripheral region.

In an example embodiment, the first conductive pattern may be between the second insulation layer and the protective insulation layer.

In an example embodiment, the functional module may be in contact with a side surface of the substrate, a side surface of the light emitting layer, a side surface of the upper electrode, a side surface of the first thin film encapsulation layer, a side surface of the third thin film encapsulation layer, a side surface of the first insulation layer, a side surface of the organic insulation pattern, a side surface of the second insulation layer, and a side surface of the protective insulation layer in a boundary of the peripheral region and the opening region.

In an example embodiment, the substrate may further include at least one second groove, which has an enlarged lower portion, between the first groove and the functional module. The first groove may surround the second groove.

In an example embodiment, the substrate may further include at least one third groove surrounding the first groove.

In an example embodiment, the OLED device may further include a block structure between the first groove and the third groove in the peripheral region on the substrate. The block structure may surround the first groove.

BRIEF DESCRIPTION OF THE DRAWINGS

Features will become apparent to those of skill in the art by describing in detail example embodiments with reference to the attached drawings in which.

DETAILED DESCRIPTION

Figure 1:
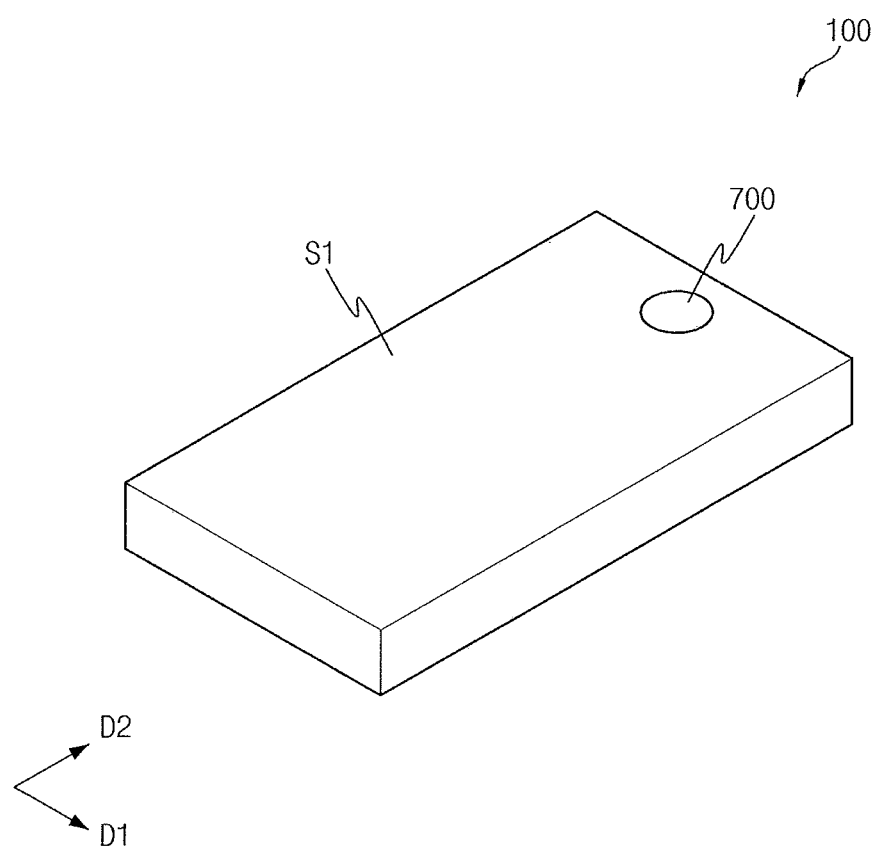
FIG. 1 illustrates a perspective view of an organic light emitting display ("OLED") device in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
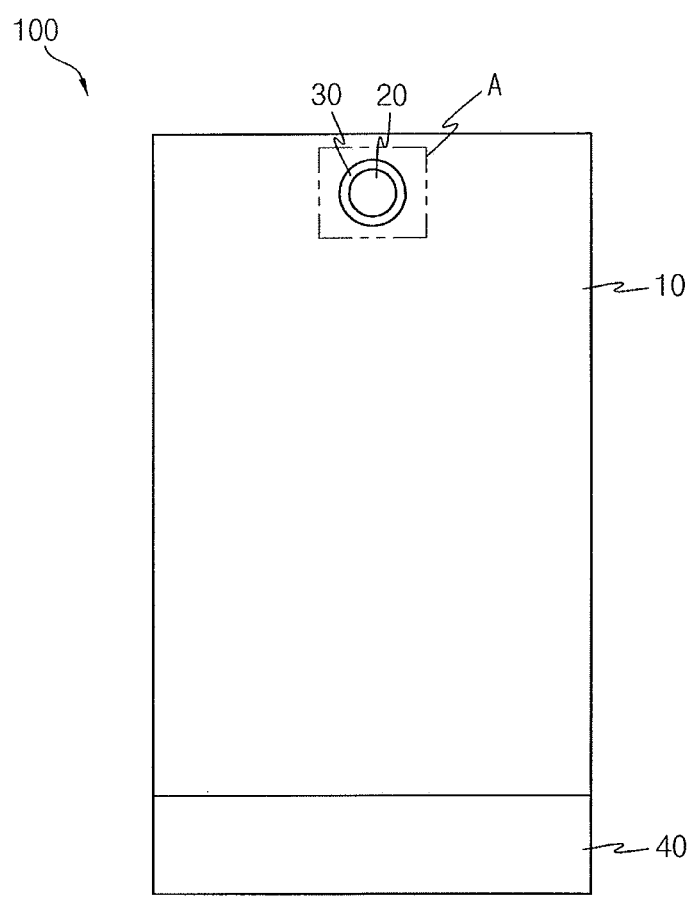
FIG. 2 illustrates a plan view of the OLED device of FIG. 1.
Figure 3:
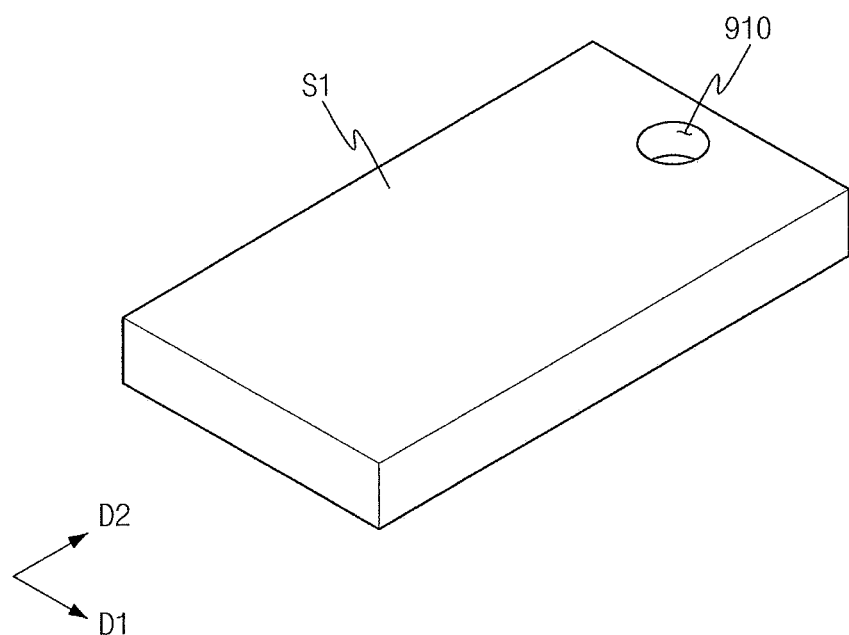
FIGS. 3 and 4 illustrate perspective views for describing an opening formed in the OLED device of FIG. 1.
Figure 4:
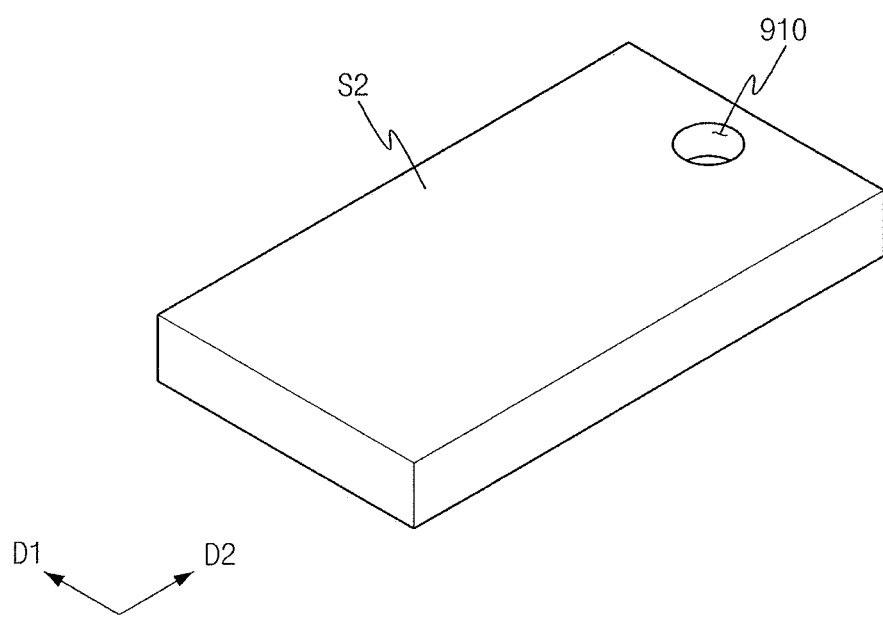

FIG. 1 is a perspective view illustrating an organic light emitting display ("OLED") device in accordance with an example embodiment, and FIG. 2 is a plan view illustrating the OLED device of FIG. 1. FIGS. 3 and 4 are perspective views for describing an opening formed in the OLED device of FIG. 1.

Referring to FIGS. 1, 2, 3, and 4, an OLED device 100 may include a functional module 700, etc. The OLED device 100 may have a first surface S1 and a second surface S2. An image may be displayed in the first surface S1, and the second surface S2 may be opposite to the first surface S1. The functional module 700 may be in a side of the OLED device 100.

As illustrated in FIG. 2, the OLED device 100 may have a display region 10, an opening region 20, a peripheral region 30, and a pad region 40. The peripheral region 30 may substantially surround the opening region 20, and the display region 10 may substantially surround the peripheral region 30. In another implementation, the display region 10 may not completely surround the peripheral region 30. As illustrated in FIGS. 3 and 4, the OLED device 100 may have an opening 910 formed in the opening region 20. The pad region 40 may be located in a side of the display region 10. A plurality of pad electrodes may be in the pad region 40, and the pad electrodes may be electrically connected to an external device. In an example embodiment, the OLED device 100 may have a bending region located between the display region 10 and the pad region 40. For example, the bending region may be bent on an axis with respect to a first direction D1 that is parallel to an upper surface of the OLED device 100, and the pad region 40 may be located on a lower surface of the OLED device 100.

The display region 10 may include a plurality of sub-pixel regions, which may be arranged in the display region 10 in a matrix form as a whole. A sub-pixel circuit (e.g., a semiconductor element 250 of FIG. 8) may be in the sub-pixel regions each of the display region 10, and an OLED (e.g., a light emitting structure 200 of FIG. 8) may be on the sub-pixel circuit. An image may be displayed in the display region 10 through the sub-pixel circuit and the OLED.

For example, first, second, and third sub-pixel circuits may be in the sub-pixel regions, and first, second, and third OLEDs may be on the first, second, and third sub-pixel circuits. The first sub-pixel circuit may be coupled to (or connected to) a first OLED capable of emitting a red color of light, and the second sub-pixel circuit may be coupled to a second OLED capable of emitting a green color of light. The third sub-pixel circuit may be coupled to the third sub-pixel structure capable of emitting a blue color of light.

In an example embodiment, the first OLED may overlap the first sub-pixel circuit, and the second OLED may overlap the second sub-pixel circuit. The third OLED may overlap the third sub-pixel circuit. In another implementation, the first OLED may overlap a portion of the first sub-pixel circuit and a portion of a sub-pixel circuit that is different from the first sub-pixel circuit, and the second OLED may overlap a portion of the second sub-pixel circuit and a portion of a sub-pixel circuit region that is different from the second sub-pixel circuit. The third OLED may overlap a portion of the third sub-pixel circuit and a portion of a sub-pixel circuit that is different from the third sub-pixel circuit.

Thus, the first, second, and third OLEDs may be arranged using an RGB stripe method where tetragons of a same size are sequentially arranged, a s-stripe method including a blue OLED having a relatively large area, a WRGB method further including a white OLED, a pen-tile method repeatedly arranged in an RG-GB pattern, etc.

In addition, at least one driving transistor, at least one switching transistor, and at least one capacitor may be in each of the sub-pixel regions.

In an example embodiment, a shape of the display region 10 may a plan shape of a tetragon, for example. In an implementation, the shape of the display region 10 may have a plan shape of a triangle, a plan shape of a diamond, a plan shape of a polygon, a plan shape of a circle, a plan shape of an athletic track, a plan shape of an ellipse, etc.

The functional module 700 may be in the opening 910. For example, the functional module 700 may include a camera module for capturing (or recognizing) an image of an object, a face recognition sensor module for sensing a face of a user, a pupil recognition sensor module for sensing a pupil of a user, acceleration and geomagnetic sensor modules for determining movement of the OLED device 100, proximity and infrared sensor modules for detecting proximity to the OLED device 100, and a light intensity sensor module for measuring the degree of brightness when left in a pocket or a bag, etc. In an example embodiment, a vibration or haptic module for indicating an incoming alarm, a speaker module for outputting sound, etc., may be in the opening 910.

In an example embodiment, a shape of the opening region 20 and the peripheral region 30 each has a plan shape of a circle, for example. In an implementation, the shape of the opening region 20 and the peripheral region 30 each may have a plan shape of a triangle, a plan shape of a diamond, a plan shape of a polygon, a plan shape of a tetragon, a plan shape of an athletic track, a plan shape of an ellipse, etc.

Figure 5:
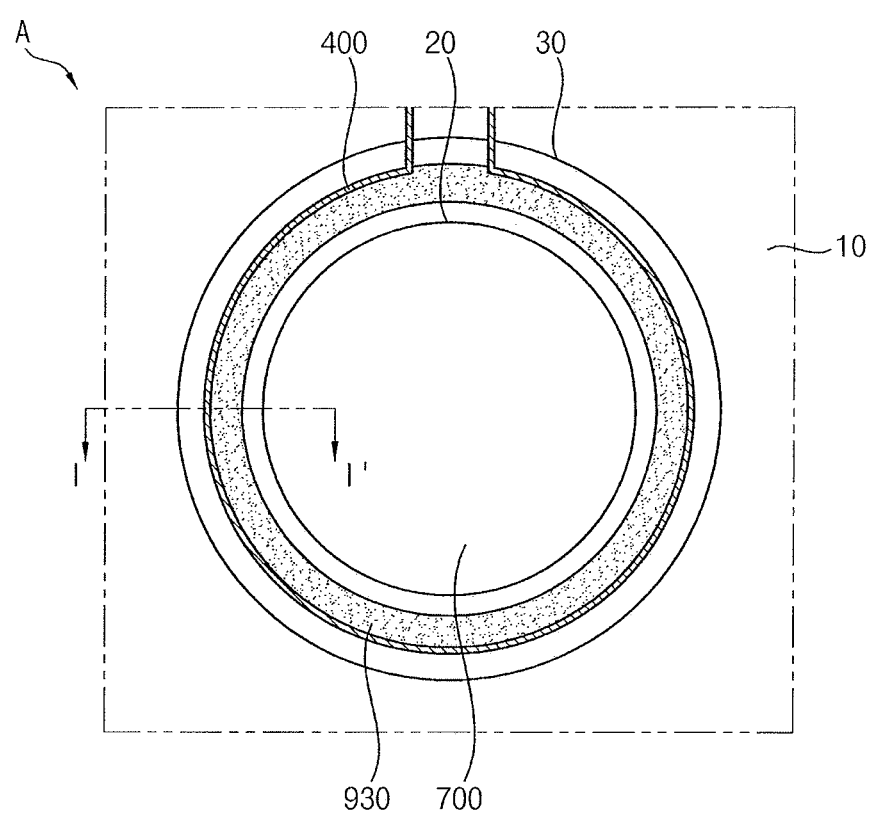
FIG. 5 illustrates a partially enlarged plan view corresponding to region 'A' of FIG. 2.
Figure 6:
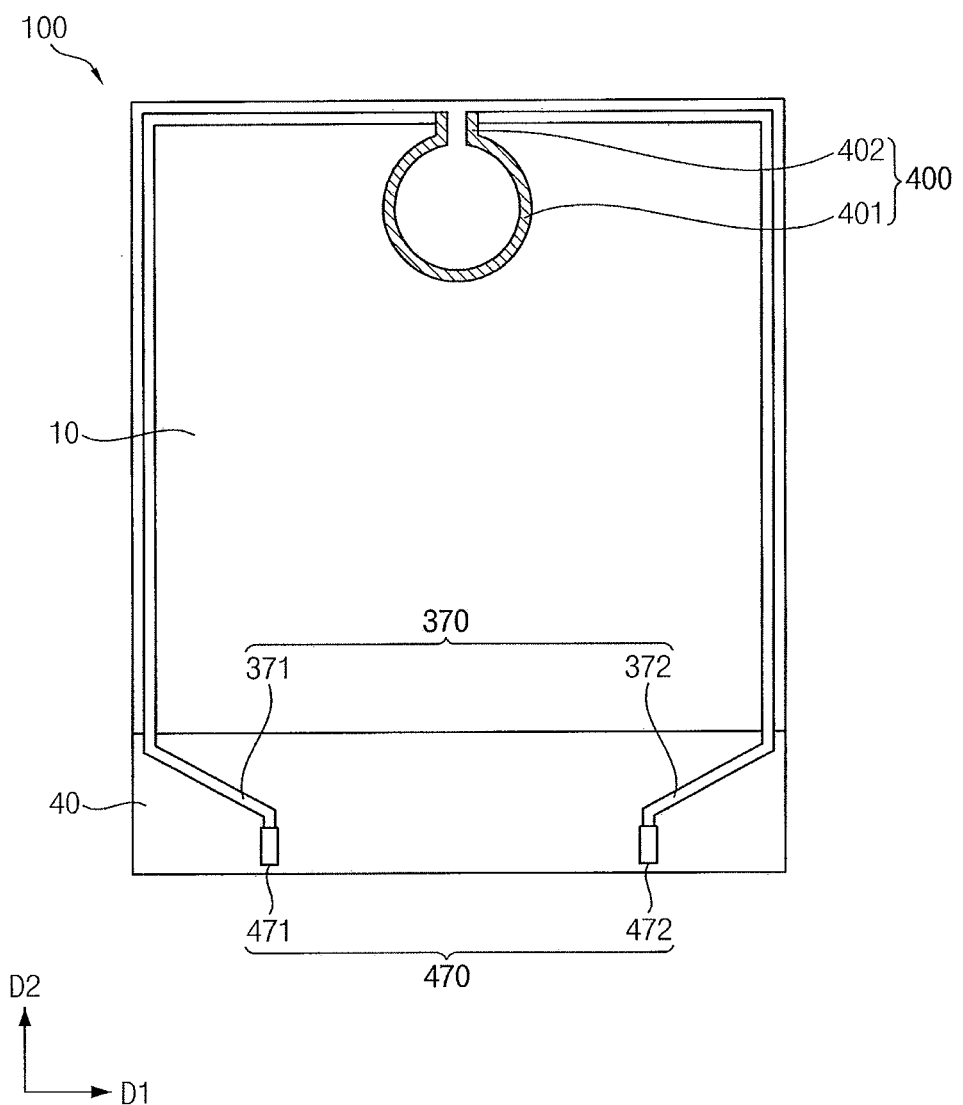
FIG. 6 illustrates a plan view for describing a conductive pattern included in the OLED device of FIG. 5.
Figure 7:
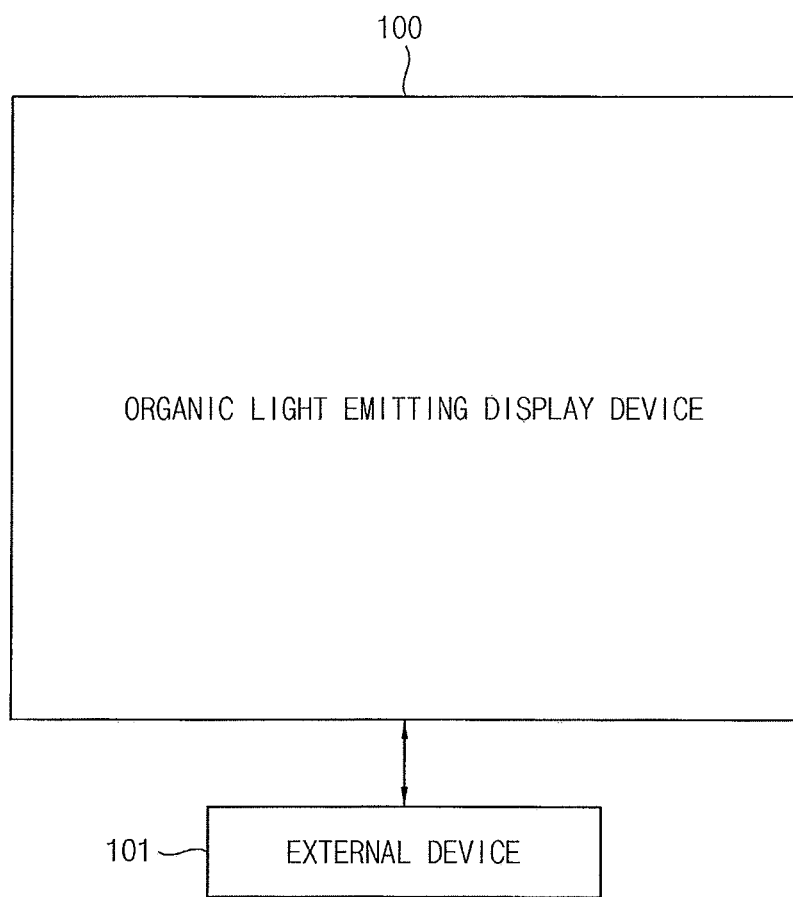
FIG. 7 illustrates a block diagram for describing an external device electrically connected to the OLED device of FIG. 6.

FIG. 5 is a partially enlarged plan view corresponding to region 'A' of FIG. 2, and FIG. 6 is a plan view for describing a conductive pattern included in the OLED device of FIG. 5. FIG. 7 is a block diagram for describing an external device electrically connected to the OLED device of FIG. 6.

Referring to FIGS. 5, 6, and 7, the OLED device 100 may include a conductive pattern 400, the functional module 700, pad electrodes 470, a connection wiring 370, etc.

In an example embodiment, the opening 910 may be formed in the opening region 20, and a groove 930 may be formed in the peripheral region 30. The groove 930 may have a plan shape of a circle in a plan view of the OLED device 100, and may surround the opening region 20. In addition, the groove 930 may have an enlarged (or expanded) lower portion in a cross-sectional view of the OLED device 100. Thus, a lower portion of the groove 930 may be relatively larger than an upper portion of the groove 930.

The functional module 700 may be in the opening 910, and the conductive pattern 400 may overlap the groove 930. Thus, the conductive pattern 400 may be disposed along a profile of an outer portion of the groove 930 on the groove 930. The conductive pattern 400 may substantially surround the functional module 700 (or the opening 910). As illustrated in FIG. 6 the conductive pattern 400 may include a first sub-conductive pattern 401 and second sub-conductive patterns 402. The first sub-conductive pattern 401 may have a plan shape of a partially opened circle including an open portion, and the second sub-conductive patterns 402 may extend from the open portion of the first sub-conductive pattern 401 in an outward direction (e.g., a direction from the opening region 20 into the peripheral region 30 or a second direction D2 that is perpendicular to the first direction D1). In an example embodiment, the first sub-conductive pattern 401 and the second sub-conductive patterns 402 may be integrally formed at a same layer. In another implementation, the first sub-conductive pattern 401 may be on the second sub-conductive patterns 402, and the open portion of the first sub-conductive pattern 401 may be connected to a distal end of the second sub-conductive patterns 402 through a contact hole. In an implementation, the second sub-conductive patterns 402 may be on the first sub-conductive pattern 401, and the open portion of the first sub-conductive pattern 401 may be connected to a distal end of the second sub-conductive patterns 402 through a contact hole. The first sub-conductive pattern 401 may overlap the groove 930. For example, the first sub-conductive pattern 401 may overlap an outermost portion of the groove 930. Thus, the first sub-conductive pattern 401 may overlap an outer boundary of the groove 930. In another implementation, the first sub-conductive pattern 401 may overlap an innermost portion of the groove 930. Thus, the first sub-conductive pattern 401 may overlap an inner boundary of the groove 930.

The conductive pattern 400 may include a metal, an alloy of a metal, metal nitride, conductive metal oxide, transparent conductive materials, etc. For example, the conductive pattern 400 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminum nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SRO), zinc oxide (ZnO), indium tin oxide (ITO), tin oxide (SnO), indium oxide (InO), gallium oxide (GaO), indium zinc oxide (IZO), etc. These may be used alone or in a suitable combination thereof. In an example embodiment, the conductive pattern 400 may have a multi-layered structure including a plurality of layers.

The pad electrodes 470 may be in the pad region 40. The pad electrodes 470 may include a first pad electrode 471 and a second pad electrode 472. For example, the first pad electrode 471 may be located in a left side of the pad region 40, and the second pad electrode 472 may be located in a right side of the pad region 40. In an example embodiment, extra pad electrodes may be further between the first pad electrode 471 and the second pad electrode 472. The pad electrodes 470 may include a metal, an alloy of a metal, metal nitride, conductive metal oxide, transparent conductive materials, etc. These may be used alone or in a suitable combination thereof. In an example embodiment, the pad electrodes 470 may have a multi-layered structure including a plurality of layers.

The connection wiring 370 may be in an outer portion of the display region 10 and the pad region 40. The connection wiring 370 may include a first connection wiring 371 and a second connection wiring 372. A first distal end of the first connection wiring 371 may be connected to the second sub-conductive pattern 402 located in a left side of the second sub-conductive patterns 402, and the first connection wiring 371 may extend along a profile of an outer portion of the display region 10 and pad region 40 in a counterclockwise direction. A second distal end, which is opposite to the first distal end, of the first connection wiring 371 may be connected to the first pad electrode 471 in the pad region 40. Similarly, a first distal end of the second connection wiring 372 may be connected to the second sub-conductive pattern 402 located in a right side of the second sub-conductive patterns 402, and the second connection wiring 372 may extend along a profile of an outer portion of the display region 10 and pad region 40 in a clockwise direction. A second distal end, which is opposite to the first distal end, of the second connection wiring 372 may be connected to the second pad electrode 472 in the pad region 40. Thus, the connection wiring 370 may electrically connect the conductive pattern 400 and the pad electrodes 470. The connection wiring 370 may include a metal, an alloy of a metal, metal nitride, conductive metal oxide, transparent conductive materials, etc. These may be used alone or in a suitable combination thereof. In an example embodiment, the connection wiring 370 may have a multi-layered structure including a plurality of layers.

As illustrated in FIG. 7, an external device 101 may be electrically connected to the OLED device 100 through a flexible printed circuit board ("FPCB"). For example, one side of the FPCB may be in direct contact with the pad electrodes 470, and another side of the FPCB may be in direct contact with the external device 101. Thus, the external device 101 may electrically connect the first pad electrode 471 and the second pad electrode 472, and may measure a resistance value between the first and second pad electrodes 471 and 472.

A general OLED device may include a substrate, and a groove having an enlarged lower portion may be formed in the substrate. The substrate may have a stack structure where a first organic film layer, a first barrier layer, a second organic film layer, and a second barrier layer are sequentially stacked. As the groove is formed in the substrate, a light emitting layer and an upper electrode may be separated (or cut, etc.) in a peripheral region. For example, the groove having the enlarged lower portion may have an under-cut shape, and the second organic film layer and the second barrier layer may be formed in the peripheral region 30. The second organic film layer may have a trench of a second width, and the second barrier layer may have an opening of a first width that overlaps the trench. The first width may be less than the second width. In addition, a protruded portion of the second barrier layer located adjacent to the opening may be defined as a tip, and the light emitting layer and the upper electrode may be separated in the peripheral region through the tip. However, the tip may be easily damaged by external impacts or a stress in a manufacturing process (e.g., a removal of top and/or bottom protection films, etc.). When the tip is damaged, the light emitting layer and the upper electrode may not be separated in the peripheral region, and moisture and/or water may be penetrated through the light emitting layer and the upper electrode. Thus, a defect of a pixel included in the general OLED device may occur by the moisture and/or water. Thus, a defect of the general OLED device may occur due to a damage of the tip, such damage to the tip should be checked for in a manufacturing process of the general OLED device. However, it may not be straightforward to visually observe the damage of the tip.

In an example embodiment, the OLED device 100 includes the conductive pattern 400, the pad electrodes 470, and the connection wiring 370, and the OLED device 100 may check whether the tip is damaged. For example, the OLED device 100 may measure a resistance value between the first and second pad electrodes 471 and 472 by using the external device 101. Accordingly, the OLED device 100 may check whether the tip is damaged by using the resistance value. Here, when the damage of the tip is generated, the resistance value may be increased or it may be in an open state by a cut of the conductive pattern 400. Thus, a defect ratio of the OLED device 100 may be reduced by the OLED device 100 checking whether the tip is damaged.

In an example embodiment, the external device 101 may generate a data signal, a gate signal, a light emission signal, a gate initialization signal, an initialization voltage, a power supply, etc. As described above, the extra pad electrodes may be further between the first and second pad electrodes 471 and 472, and the external device 101 may be electrically connected to the extra pad electrodes. In this case, the external device 101 may provide the data signal, the gate signal, the light emission signal, the gate initialization signal, the initialization voltage, the power supply, etc. to the OLED device 100. In addition, a driving integrated circuit may be installed in the FPCB. In another implementation, the driving integrated circuit may be installed in a portion, which is located adjacent to the pad electrode 470, of the OLED device 100.

Figure 8:
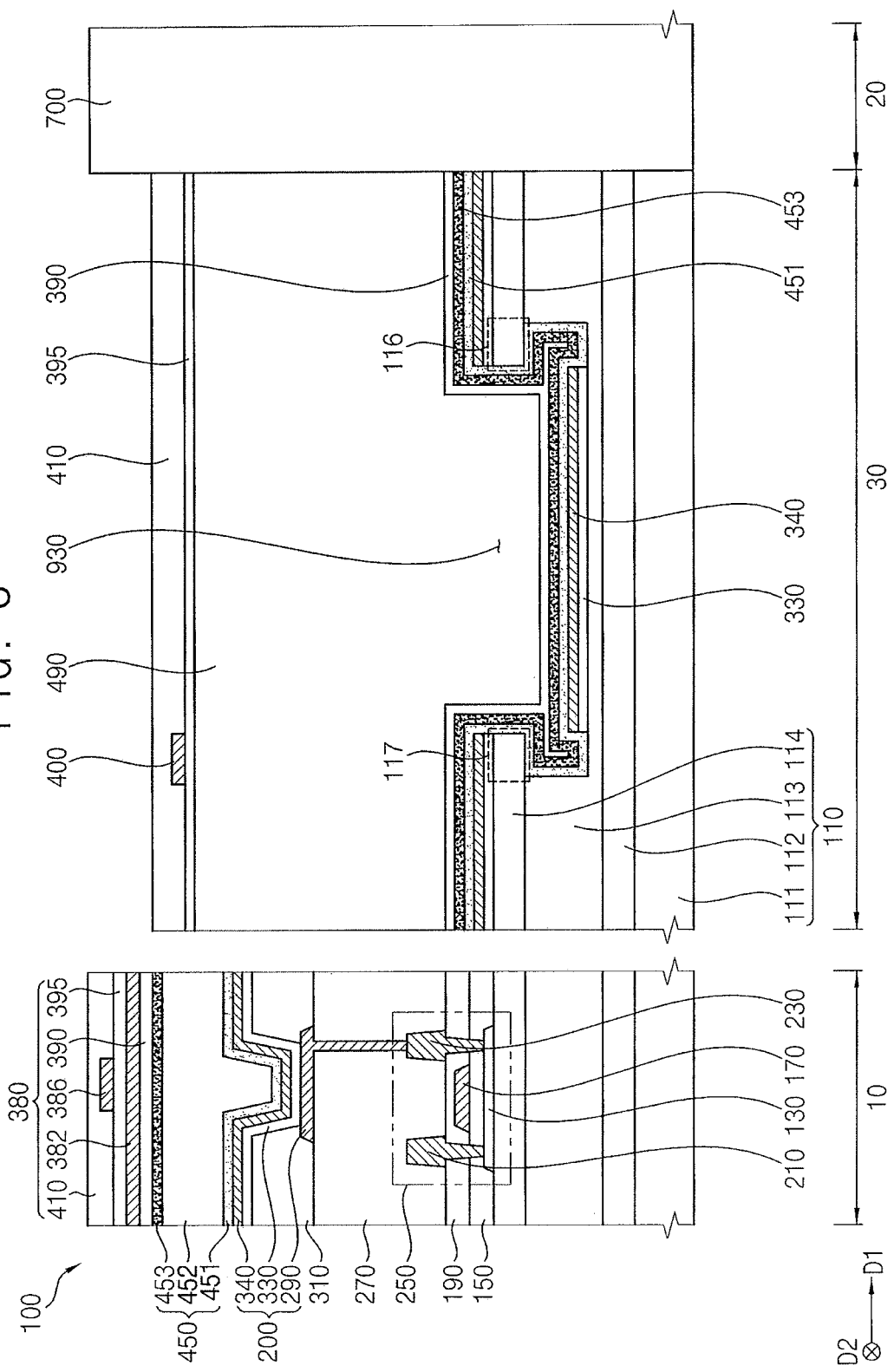
FIG. 8 illustrates a cross-sectional view taken along lines I-I' of FIG. 5.
Figure 9:
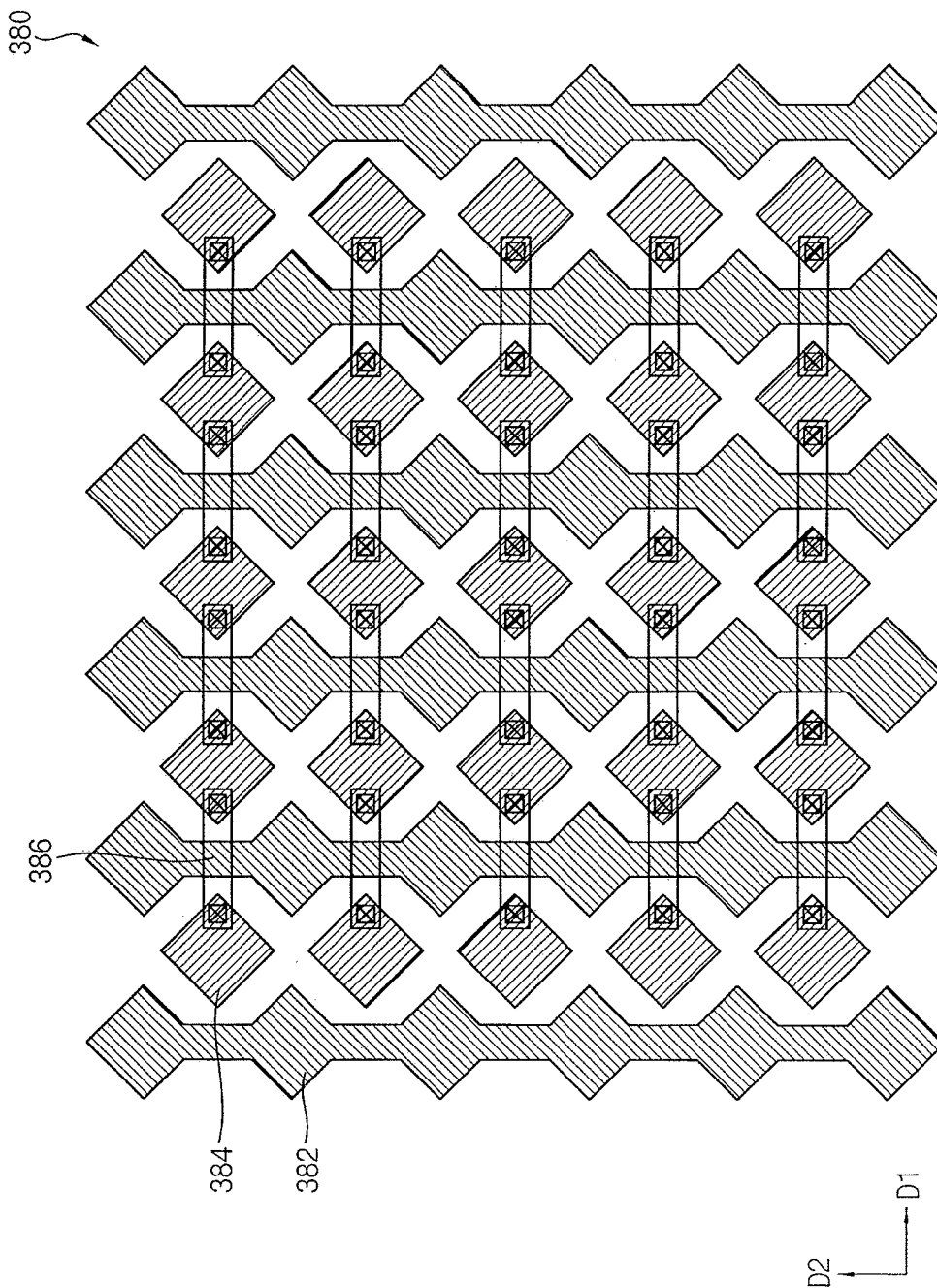
FIG. 9 illustrates a plan view for describing a touch screen structure included in the OLED device of FIG. 8.

FIG. 8 is a cross-sectional view taken along lines I-I' of FIG. 5, and FIG. 9 is a plan view for describing a touch screen structure included in the OLED device of FIG. 8.

Referring to FIGS. 8 and 9, the OLED device 100 may include a substrate 110, a semiconductor element 250, a planarization layer 270, a light emitting structure 200, a pixel defining layer 310, a thin film encapsulation ("TFE") structure 450, a touch screen structure 380, an organic insulation pattern 490, a conductive pattern 400, a functional module 700, etc. The substrate 110 may include a first organic film layer 111, a first barrier layer 112, a second organic film layer 113, and a second barrier layer 114. In the OLED device 100 having the display region 10, the opening region 20, the peripheral region 30, and the pad region 40, the substrate 110 may be divided into the display region 10, the opening region 20, the peripheral region 30, and the pad region 40. In addition, the semiconductor element 250 may include an active layer 130, a gate insulation layer 150, a gate electrode 170, an insulating interlayer 190, a source electrode 210, and a drain electrode 230, and the light emitting structure 200 may include a lower electrode 290, a light emitting layer 330, and an upper electrode 340. Further, the TFE structure 450 may include a first TFE layer 451, a second TFE layer 452, and a third TFE layer 453, and the touch screen structure 380 may include a first insulation layer 390, a plurality of first touch screen electrodes 382, a plurality of second touch screen electrodes 384, a plurality of touch screen connection electrodes 386, a second insulation layer 395, and a protective insulation layer 410.

In an example embodiment, the substrate 110 may further include a groove 930 formed in the peripheral region 30, and each of the light emitting layer 330 and the upper electrode 340 may be separated in an inner portion (or an inside) of the groove 930. Thus, each of the light emitting layer 330 and the upper electrode 340 may be separated in the inner portion of the groove 930. In the OLED device 100 having the light emitting layer 330 and the upper electrode 340 that are separated in the inner portion of the groove 930, the OLED device 100 may block moisture, water, etc. from permeating into the semiconductor element 250 and the light emitting structure 200. In addition, the substrate 110 may have an opening 910 formed in the opening region 20, and the functional module 700 may be in the opening 910 (refer to FIG. 20).

The first organic film layer 111 may be provided. The first organic film layer 111 may include organic materials having flexibility. For example, the first organic film layer 111 may include a random copolymer or a block copolymer. In addition, the first organic film layer 111 may have a high transparency, a low coefficient of thermal expansion, and a high glass transition temperature. In the case that the first organic film layer 111 includes an imide radical, a heat resistance, a chemical resistance, a wear resistance, and an electrical characteristics may be excellent. In an example embodiment, the first organic film layer 111 may include polyimide.

The first barrier layer 112 may be on the entire first organic film layer 111. The first barrier layer 112 may block water and/or moisture that is permeated through the first organic film layer 111. The first barrier layer 112 may include inorganic materials having flexibility. In an example embodiment, the first barrier layer 112 may include silicon oxide, silicon nitride, etc. For example, the first barrier layer 112 may include silicon oxide (SiO), silicon nitride (SiN), silicon oxynitride (SiON), silicon oxycarbide (SiOC), silicon carbon nitride (SiCN), aluminum oxide (AlO), aluminum nitride (AlN), tantalum oxide (TaO), hafnium oxide (HfO), zirconium oxide (ZrO), titanium oxide (TiO), etc.

The second organic film layer 113 may be on the entire first barrier layer 112. In an example embodiment, the second organic film layer 113 may have a trench in the peripheral region 30. Thus, a portion of the second organic film layer 113 located in the peripheral region 30 may be partially removed. A width of the trench may be defined as a second width W2 (refer to FIG. 13). In another implementation, a portion of the second organic film layer 113 located in the peripheral region 30 may be completely removed, such that the second organic film layer 113 may have an opening in the peripheral region 30. In this case, an upper surface of the first barrier layer 112 may be exposed through the opening.

The second organic film layer 113 may include organic materials having flexibility. For example, the first barrier layer 112 may include random copolymer or block copolymer. In an example embodiment, the second organic film layer 113 may include polyimide.

The second barrier layer 114 may be on the entire second organic film layer 113. In an example embodiment, the second barrier layer 114 may have an opening in the peripheral region 30. Thus, the second barrier layer 114 may have first and second protruded portions 116 and 117 (or a tip) that protrude in an inner portion of the trench on the trench, and may have an opening defined by the first and second protruded portions 116 and 117. For example, the first protruded portion 116 may be located adjacent to a boundary of the peripheral region 30 and the opening region 20 (e.g., the opening 910 of the substrate 110). The second protruded portion 117 may face the first protruded portion 116, and may be spaced apart from the first protruded portion 116. A width of the opening of the second barrier layer 114 may have a first width W1 that is less than the second width W2 (refer to FIG. 13). In addition, a space located under each of the first and second protruded portions 116 and 117 may be defined as first and second spaces 118 and 119 (refer to FIG. 14). The trench of the second organic film layer 113, the first and second protruded portions 116 and 117 of the second barrier layer 114, and the opening of the second barrier layer 114 may be defined as the groove 930, which has an enlarged lower portion, formed in the OLED device 100 located in the peripheral region 30. For example, the groove 930 having the enlarged lower portion may have an under-cut shape. The groove 930 may serve as a block pattern capable of blocking water and/or moisture permeated from the opening region 20 into the display region 10. In an example embodiment, a plurality of grooves may be formed between the groove 930 and the functional module 700, and may be formed between the light emitting structure 200 and the groove 930 that are located adjacent to a boundary of the display region 10 and the peripheral region 30.

The second barrier layer 114 may block water and/or moisture that is permeated through the second organic film layer 113. The second barrier layer 114 may include inorganic materials having flexibility. In an example embodiment, the second barrier layer 114 may include SiO, SiN, etc.

Accordingly, the substrate 110 including the first organic film layer 111, the first barrier layer 112, the second organic film layer 113, and the second barrier layer 114 may be disposed.

In an example embodiment, the substrate 110 includes four layers, but the substrate 110 may include, for example, a single layer or at least two layers.

In an example embodiment, the substrate 110 may include transparent or opaque materials. For example, the substrate 110 may include a quartz substrate, a synthetic quartz substrate, a calcium fluoride substrate, a fluoride-doped quartz substrate, a soda-lime glass substrate, a non-alkali glass substrate, etc.

The buffer layer may be on the substrate 110 (e.g., the second barrier layer 114). For example, the buffer layer may be on the entire substrate 110 except for the peripheral region 30. In another implementation, the buffer layer may be in the peripheral region 30 on the substrate 110. In this case, the buffer layer may have an opening overlapping the opening of the second barrier layer 114. The buffer layer may help prevent the diffusion of metal atoms and/or impurities from the substrate 110 into the semiconductor element 250 and the light emitting structure 200. In addition, the buffer layer may control a rate of a heat transfer in a crystallization process for forming an active layer, thereby obtaining substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may include organic materials or inorganic materials.

The active layer 130 may be in the display region 10 on the substrate 110. The active layer 130 may include an oxide semiconductor, an inorganic semiconductor (e.g., amorphous silicon, polysilicon, etc.), an organic semiconductor, etc. The active layer 130 may have a source region and a drain region.

The gate insulation layer 150 may be on the active layer 130. The gate insulation layer 150 may cover the active layer 130 in the display region 10 on the substrate 110, and may not be in the peripheral region 30. Thus, the gate insulation layer 150 may be only in the display region 10 on the substrate 110. For example, the gate insulation layer 150 may sufficiently cover the active layer 130 on the substrate 110, and may have a substantially flat upper surface without a step around the active layer 130. In another implementation, the gate insulation layer 150 may cover the active layer 130 on the substrate 110, and may be disposed with a substantially uniform thickness along a profile of the active layer 130. The gate insulation layer 150 may include silicon compound, metal oxide, etc. In an example embodiment, the gate insulation layer 150 may have a multi-layered structure including a plurality of insulation layers. For example, the insulation layers may have different thicknesses to each other or include different materials to each other.

The gate electrode 170 may be in the display region 10 on the gate insulation layer 150. The gate electrode 170 may be on a portion of the gate insulation layer 150 under which the active layer 130 is located. The gate electrode 170 may include a metal, a metal alloy, metal nitride, conductive metal oxide, transparent conductive materials, etc. These may be used alone or in a suitable combination thereof. In another implementation, the gate electrode 170 may have a multi-layered structure including a plurality of layers.

The insulating interlayer 190 may be on the gate electrode 170. The insulating interlayer 190 may cover the gate electrode 170 in the display region 10 on the gate insulation layer 150, and may not be in the peripheral region 30. Thus, the insulating interlayer 190 may be only in the display region 10 on the gate insulation layer 150. For example, the insulating interlayer 190 may sufficiently cover the gate electrode 170 on the gate insulation layer 150, and may have a substantially flat upper surface without a step around the gate electrode 170. In another implementation, the insulating interlayer 190 may cover the gate electrode 170 on the gate insulation layer 150, and may be disposed with a substantially uniform thickness along a profile of the gate electrode 170. The insulating interlayer 190 may include silicon compound, metal oxide, etc. In an example embodiment, the insulating interlayer 190 may have a multi-layered structure including a plurality, of insulation layers. The insulation layers may have different thicknesses to each other or include different materials to each other.

The source electrode 210 and the drain electrode 230 may be in the display region 10 on the insulating interlayer 190. The source electrode 210 may be connected to the source region of the active layer 130 via a contact hole formed by removing a first portion of the gate insulation layer 150 and the insulating interlayer 190. The drain electrode 230 may be connected to the drain region of the active layer 130 via a contact hole formed by removing a second portion of the gate insulation layer 150 and the insulating interlayer 190. Each of the source electrode 210 and the drain electrode 230 may include a metal, an alloy, metal nitride, conductive metal oxide, transparent conductive materials, etc. These may be used alone or in a suitable combination thereof. In an example embodiment, each of the source and drain electrodes 210 and 230 may have a multi-layered structure including a plurality of layers. Accordingly, the semiconductor element 250 including the active layer 130, the gate insulation layer 150, the gate electrode 170, the insulating interlayer 190, the source electrode 210, and the drain electrode 230 may be disposed.

In an example embodiment, the semiconductor element 250 may have a top gate structure, for example. In another implementation, in an example embodiment, the semiconductor element 250 may have a bottom gate structure, a double gate structure, etc.

In addition, the OLED device 100 may include one semiconductor element, for example. In another implementation, in an example embodiment, the OLED device 100 may include at least one semiconductor element and at least one capacitor.

The planarization layer 270 may be on the insulating interlayer 190, the source electrode 210, and the drain electrode 230. The planarization layer 270 may cover the source and drain electrodes 210 and 230 in the display region 10 on the insulating interlayer 190, and may not be in the peripheral region 30. Thus, the planarization layer 270 may be only in the display region 10 on the insulating interlayer 190. For example, the planarization layer 270 may be disposed with a relatively high thickness in the display region 10. In this case, the planarization layer 270 may have a substantially flat upper surface, and a planarization process may be further performed on the planarization layer 270 to implement the flat upper surface of the planarization layer 270. In another implementation, the planarization layer 270 may be disposed with a substantially uniform thickness along a profile of the source and drain electrodes 210 and 230 in the display region 10 on the insulating interlayer 190. The planarization layer 270 may include organic materials or inorganic materials. In an example embodiment, the planarization layer 270 may include organic materials.

The lower electrode 290 may be in the display region 10 on the planarization layer 270. The lower electrode 290 may be connected to the drain electrode 230 via a contact hole formed by removing a portion of the planarization layer 270. In addition, the lower electrode 290 may be electrically connected to the semiconductor element 250. The lower electrode 290 may include a metal, a metal alloy, metal nitride, conductive metal oxide, transparent conductive materials, etc. These may be used alone or in a suitable combination thereof. In an example embodiment, the lower electrode 290 may have a multi-layered structure including a plurality of layers.

The pixel defining layer 310 may be in the display region 10 on the planarization layer 270, and may not be in the peripheral region 30. Thus, the pixel defining layer 310 may be only in the display region 10. For example, the pixel defining layer 310 may cover both lateral portions of the lower electrode 290, and may expose a portion of an upper surface of the lower electrode 290. The pixel defining layer 310 may include organic materials or inorganic materials. In an example embodiment, the pixel defining layer 310 may include organic materials.

The light emitting layer 330 may be on the pixel defining layer 310 and the lower electrode 290 in the display region 10 and extend in the first direction D1, and may be in the peripheral region 30 on the substrate 110. In an example embodiment, the light emitting layer 330 may be partially in an inner portion of the groove 930, and the light emitting layer 330 in a portion where the groove 930 is located may be separated in a depth direction (e.g., a direction from the second barrier layer 114 into the first organic film layer 111). Thus, the light emitting layer 330 may be separated in the peripheral region 30. Thus, the light emitting layer 330 may be separated in the peripheral region 30 by the first and second spaces 118 and 119.

For example, when the groove 930 does not have the first and second protruded portions 116 and 117, the light emitting layer 330 may be continuously disposed in a portion where the groove 930 is formed, and the light emitting layer 330 may act as a permeability path of water and/or moisture. Thus, a portion of the light emitting layer 330 (e.g., a side distal end of the light emitting layer 330) may be exposed in the opening region 20, and the water and/or moisture may permeate into the exposed portion of the light emitting layer 330. In this case, the semiconductor element 250 and the light emitting structure 200 that are in the display region 10 located adjacent to the peripheral region 30 may be damaged by the water and/or moisture. Meanwhile, in accordance with an example embodiment, the OLED device 100 includes the groove 930 having the enlarged lower portion. Thus, the light emitting layer 330 may be separated in the inner portion of the groove 930, such that the permeation path of the light emitting layer 330 may be blocked. Accordingly, when the light emitting layer 330 is in the peripheral region 30, a defect of a pixel included in the OLED device 100 may not occur.

The light emitting layer 330 may have a multi-layered structure including an organic light emission layer ("EML"), a hole injection layer ("HIL"), a hole transport layer ("HTL"), an electron transport layer ("ETL"), an electron injection layer ("EIL"), etc. In an example embodiment, the EML, the HIL, the HTL, the ETL, and the EIL may be in the peripheral region 30. In an example embodiment, the HIL, the HTL, the ETL, and the EIL except for the EML may be in the peripheral region 30.

The EML of the light emitting layer 330 may be formed using at least one of light emitting materials capable of generating different colors of light (e.g., a red color of light, a blue color of light, and a green color of light, etc.) according to sub-pixels. In another implementation, the EML of the light emitting layer 330 may generally generate a white color of light by stacking a plurality of light emitting materials capable of generating different colors of light such as a red color of light, a green color of light, a blue color of light, etc. In this case, a color filter may be on the light emitting layer 330 that is located on the lower electrode 290. The color filter may include at least one selected from a red color filter, a green color filter, and a blue color filter. In another implementation, the color filter may include a yellow color filter, a cyan color filter, and a magenta color filter. The color filter may include a photosensitive resin, a color photoresist, etc.

The upper electrode 340 may be on the light emitting layer 330. The upper electrode 340 may overlap the light emitting layer 330 in the display region 10 and extend in the first direction D1, and may be in the peripheral region 30 on the light emitting layer 330. In an example embodiment, the upper electrode 340 may be partially in the inner portion of the groove 930, and the upper electrode 340 in a portion where the groove 930 is located may be separated in the depth direction. Thus, the upper electrode 340 may be separated in the peripheral region 30. Thus, the upper electrode 340 may be separated in the peripheral region 30 by the first and second spaces 118 and 119.

For example, when the groove 930 does not have the first and second protruded portions 116 and 117, the upper electrode 340 may be continuously disposed in a portion where the groove 930 is formed, and the upper electrode 340 may act as a permeation path of water and/or moisture. Thus, a portion of the upper electrode 340 (e.g., a side distal end of the upper electrode 340) may be exposed in the opening region 20, and the water and/or moisture may permeate into the exposed portion of the upper electrode 340. In this case, the semiconductor element 250 and the light emitting structure 200 that are in the display region 10 located adjacent to the peripheral region 30 may be damaged by the water and/or moisture. Meanwhile, in accordance with an example embodiment, the OLED device 100 may include the groove 930 having the enlarged lower portion. Thus, the upper electrode 340 may be separated in the inner portion of the groove 930. Thus, as the upper electrode 340 is separated in the inner portion of the groove 930, the permeation path of the upper electrode 340 may be blocked. Accordingly, when the upper electrode 340 is in the peripheral region 30, a defect of a pixel included in the OLED device 100 may not occur.

The upper electrode 340 may include a metal, a metal alloy, metal nitride, conductive metal oxide, transparent conductive materials, etc. These may be used alone or in a suitable combination thereof. In an example embodiment, the upper electrode 340 may have a multi-layered structure including a plurality of layers.

Accordingly, the light emitting structure 200 including the lower electrode 290, the light emitting layer 330, and the upper electrode 340 may be disposed.

A capping layer may be on the upper electrode 340. The capping layer may overlap the upper electrode 340 in the display region 10 and extend in the first direction D1, and may be in the peripheral region 30 on the upper electrode 340. In an example embodiment, the capping layer may be partially in the inner portion of the groove 930, and the capping layer in a portion where the groove 930 is located may be separated in the depth direction. Thus, the capping layer may be separated in the peripheral region 30. Thus, the capping layer may be separated in the peripheral region 30 by the first and second spaces 118 and 119.

For example, when the groove 930 does not have the first and second protruded portions 116 and 117, the capping layer may be disposed continuously in a portion where the groove 930 is formed, and the capping layer may act as a permeation path of water and/or moisture. Thus, a portion of the capping layer (e.g., a side distal end of the capping layer) may be exposed in the opening region 20, and the water and/or moisture may permeate into the exposed portion of the capping layer. In this case, the semiconductor element 250 and the light emitting structure 200 that are in the display region 10 located adjacent to the peripheral region 30 may be damaged by the water and/or moisture. Meanwhile, in accordance with an example embodiment, the OLED device 100 includes the groove 930 having the enlarged lower portion. Thus, the capping layer may be separated in the inner portion of the groove 930. Thus, as the capping layer is separated in the inner portion of the groove 930, the permeation path of the capping layer may be blocked. Accordingly, when the capping layer is in the peripheral region 30, a defect of a pixel included in the OLED device 100 may not occur.

The capping layer may protect the light emitting structure 200, and may include organic materials or inorganic materials. In an example embodiment, the capping layer may include organic materials such as a triamine derivative, arylenediamine derivative, 4,4'-N,N'-dicarbazole-biphenyl ("CBP"), tris(8-hydroxyquinolate)aluminum ("Alq3"), etc.

The first TFE layer 451 may be in the display region 10 and the peripheral region 30 on the upper electrode 340. The first TFE layer 451 may cover the upper electrode 340 in the display region 10, and may be disposed with a substantially uniform thickness along a profile of the upper electrode 340 and may extend in the peripheral region 30. The first TFE layer 451 may be disposed along a profile of the upper electrode 340 in the peripheral region 30. Thus, the first TFE layer 451 may be continuously disposed in a portion where the groove 930 is formed. In an example embodiment, the first TFE layer 451 may completely cover the groove 930. Thus, the first TFE layer 451 may cover the first and second protruded portions 116 and 117, and may be in the first and second spaces 118 and 119 and completely cover the light emitting layer 330 and the upper electrode 340 that are disposed inside the groove 930. Thus, the first TFE layer 451 may be in direct contact with the second organic film layer 113 in the first and second spaces 118 and 119. The first TFE layer 451 may help prevent the light emitting structure 200 from being deteriorated by the permeation of moisture, water, oxygen, etc. In addition, the first TFE layer 451 may protect the light emitting structure 200 from external impacts. The first TFE layer 451 may include inorganic materials having flexibility.

The second TFE layer 452 may be in the display region 10 on the first TFE layer 451, and may not be in the peripheral region 30. Thus, the second TFE layer 452 may be only in the display region 10. In another implementation, the second TFE layer 452 may be in a portion of the peripheral region 30. The second TFE layer 452 may improve the flatness of the OLED device 100, and may protect the light emitting structure 200. The second TFE layer 452 may include organic materials having the flexibility.

The third TFE layer 453 may be in the display region 10 on the second TFE layer 452 and in the peripheral region 30 on the first TFE layer 451. The third TFE layer 453 may cover the second TFE layer 452 in the display region 10, and may be disposed with a substantially uniform thickness along a profile of the second TFE layer 452 and may extend in the peripheral region 30. The third TFE layer 453 may be disposed with a substantially uniform thickness along a profile of the first TFE layer 451 in the peripheral region 30. Thus, the third TFE layer 453 may be continuously formed in a portion where the groove 930 is formed. The third TFE layer 453 together with the first TFE layer 451 may help prevent the light emitting structure 200 from being deteriorated by the permeation of moisture, water, oxygen, etc. In addition, the third TFE layer 453 together with the first and second TFE layers 451 and 452 may protect the light emitting structure 200 from external impacts. The third TFE layer 453 may include inorganic materials having the flexibility.

Accordingly, the TFE structure 450 including the first TFE layer 451, the second TFE layer 452, and the third TFE layer 453 may be disposed. In another implementation, the TFE structure 450 may have five layers structure where first to fifth TFE layers are stacked or seven layers structure where first to seventh TFE layers are stacked.

The first insulation layer 390 may be in the display region 10 and the peripheral region 30 on the third TFE layer 453. The first insulation layer 390 may cover the third TFE layer 453 in the display region 10, and may be disposed with a substantially uniform thickness along a profile of the third TFE layer 453 and may extend in the peripheral region 30.

The first insulation layer 390 may be disposed with a substantially uniform thickness along a profile of the third TFE layer 453 in the peripheral region 30. Thus, the first insulation layer 390 may be continuously disposed in a portion where the first insulation layer 390 is formed. The first insulation layer 390 may include organic materials or inorganic materials. In another implementation, the first insulation layer 390 may have a multi-layered structure including a plurality of insulation layers. For example, the insulation layers may have different thicknesses to each other or include different materials to each other.

The organic insulation pattern 490 may be in the peripheral region 30 on the first insulation layer 390. In an example embodiment, the organic insulation pattern 490 may be only in the peripheral region 30. In another implementation, the organic insulation pattern 490 may be in a portion of the display region 10. The organic insulation pattern 490 may be disposed with a relatively high thickness in the peripheral region 30 on the first insulation layer 390. In this case, the organic insulation pattern 490 may have a substantially flat upper surface, and a planarization process may be further performed on the organic insulation pattern 490 to implement the flat upper surface of the organic insulation pattern 490. In another implementation, the organic insulation pattern 490 may be disposed with a substantially uniform thickness along a profile of the first insulation layer 390 in the display region 10 on the first insulation layer 390. The organic insulation pattern 490 may include organic materials or inorganic materials. In an example embodiment, the organic insulation pattern 490 may include organic materials such as a photoresist, a polyacryl-based resin, a polyimide-based resin, a polyamide-based resin, a siloxane-based resin, an acryl-based resin, an epoxy-based resin, etc.

The first touch screen electrodes 382 and the second touch screen electrodes 384 may be in the display region 10 on the first insulation layer 390. As illustrated in FIG. 9, each of the first touch screen electrodes 382 may extend in the second direction D2, and may be spaced apart from each other by the first direction D1. The second touch screen electrodes 384 may be spaced apart from each other in the second direction D2 between adjacent two first touch screen electrodes 382 among the first touch screen electrodes 382. For example, each of the first and second touch screen electrodes 382 and 384 may include a carbon nano-tube (CNT), transparent conductive oxide, ITO, indium gallium zinc oxide (IGZO), ZnO, a graphene, Ag nanowire (AgNW), Cu, Cr, etc.

The second insulation layer 395 may be in the display region 10 on the first and second touch screen electrodes 382 and 384. The second insulation layer 395 may cover the first and second touch screen electrodes 382 and 384 in the display region 10, and may be disposed with a substantially uniform thickness along a profile of the first and second touch screen electrodes 382 and 384 and may extend in the peripheral region 30. The second insulation layer 395 may be disposed along a profile of the organic insulation pattern 490 in the peripheral region 30. Thus, the second insulation layer 395 may be in contact with an upper surface of the first insulation layer 390 in the display region 10, and may be in contact with an upper surface of the organic insulation pattern 490 in the peripheral region 30. The second insulation layer 395 may include organic materials or inorganic materials. In another implementation, the second insulation layer 395 may have a multi-layered structure including a plurality of insulation layers. The insulation layers may have different thicknesses to each other or include different materials to each other.

The touch screen connection electrodes 386 may be in the display region 10 on the second insulation layer 395. As illustrated in FIG. 9, the touch screen connection electrodes 386 may electrically connect adjacent two second touch screen electrodes 384 in the first direction D1 among the second touch screen electrodes 384 through a contact hole. For example, the touch screen connection electrodes 386 and the first and second touch screen electrodes 382 and 384 may have same materials. In another implementation, the touch screen connection electrodes 386 may, include a metal, an alloy of a metal, metal nitride, conductive metal oxide, transparent conductive materials, etc. These may be used alone or in a suitable combination thereof.

The conductive pattern 400 may be in the peripheral region 30 on the second insulation layer 395. In an example embodiment, to detect a damage of the second protruded portion 117 (or the first protruded portion 116), the conductive pattern 400 may overlap the second protruded portion 117 of the groove 930. In another implementation, the conductive pattern 400 may overlap the first protruded portion 116.

For example, the conductive pattern 400 on the groove 930 may be disposed along a profile of the second protruded portion 117 of the groove 930. The conductive pattern 400 may substantially surround the functional module 700 (or the opening 910). The conductive pattern 400 may include a first sub-conductive pattern 401 and second sub-conductive patterns 402 (refer to FIG. 6). The first sub-conductive pattern 401 may have a plan shape of a partially opened circle including an open portion, and the second sub-conductive patterns 402 may extend from the open portion of the first sub-conductive pattern 401 in the second direction D2. In an example embodiment, the first sub-conductive pattern 401 and the second sub-conductive patterns 402 may be integrally formed at a same layer.

In another implementation, the first sub-conductive pattern 401 may be on the second sub-conductive patterns 402, and the open portion of the first sub-conductive pattern 401 may be connected to a distal end of the second sub-conductive patterns 402 through a contact hole. In another implementation, the second sub-conductive patterns 402 may be on the first sub-conductive pattern 401, and the open portion of the first sub-conductive pattern 401 may be connected to a distal end of the second sub-conductive patterns 402 through a contact hole.

The first sub-conductive pattern 401 may overlap the groove 930. For example, the first sub-conductive pattern 401 may overlap an outermost portion of the groove 930. Thus, the first sub-conductive pattern 401 may overlap an outer boundary of the groove 930. In another implementation, the first sub-conductive pattern 401 may overlap an innermost portion of the groove 930. Thus, the first sub-conductive pattern 401 may overlap an inner boundary of the groove 930.

The conductive pattern 400 and the touch screen connection electrodes 386 may be simultaneously formed using same materials. In another implementation, the conductive pattern 400 and the first and second touch screen electrodes 382 and 384 may be simultaneously formed using same materials.

The protective insulation layer 410 may be in the display region 10 and the peripheral region 30 on the second insulation layer 395, the touch screen connection electrodes 386, and the conductive pattern 400. The protective insulation layer 410 may be disposed with a relatively high thickness on the second insulation layer 395. In this case, the protective insulation layer 410 may have a substantially flat upper surface. In another implementation, the protective insulation layer 410 may cover the touch screen connection electrodes 386 and the conductive pattern 400 in the display region 10 and the peripheral region 30 on the second insulation layer 395, and may be disposed with a substantially uniform thickness along a profile of the touch screen connection electrodes 386 and the conductive pattern 400. The protective insulation layer 410 may include organic materials or inorganic materials. In an example embodiment, the protective insulation layer 410 may include organic materials.

As described above, the touch screen structure 380 including the first insulation layer 390, the first touch screen electrodes 382, the second touch screen electrodes 384, the second insulation layer 395, the touch screen connection electrodes 386, and the protective insulation layer 410 may be arranged.

The functional module 700 may be in the opening region 20. In an example embodiment, the functional module 700 may be in contact with a side surface of the substrate 110, a side surface of the light emitting layer 330, a side surface of the upper electrode 340, a side surface of the first TFE layer 451, a side surface of the third TFE layer 453, a side surface of the first insulation layer 390, a side surface of the organic insulation pattern 490, a side surface of the second insulation layer 395, and a side surface of the protective insulation layer 410 in a boundary of the peripheral region 30 and the opening region 20.

For example, the functional module 700 may include a camera module, a face recognition sensor module, a pupil recognition sensor module, acceleration and geomagnetic sensor modules, proximity and infrared sensor modules, and a light intensity sensor module, etc. In an example embodiment, a vibration or haptic module for indicating an incoming alarm, a speaker module for outputting sound, etc. may be in the opening 910.

The OLED device 100 in accordance with an example embodiment includes the conductive pattern 400, the pad electrodes 470, and the connection wiring 370. Thus, the OLED device 100 may check whether the second protruded portion 117 is damaged. Accordingly, a defect ratio of the OLED device 100 may be reduced by the OLED device 100 checking whether the second protruded portion 117 is damaged.

FIGS. 10 through 20 are cross-sectional views illustrating a method of manufacturing an OLED device in accordance with an example embodiment.

Figure 10:
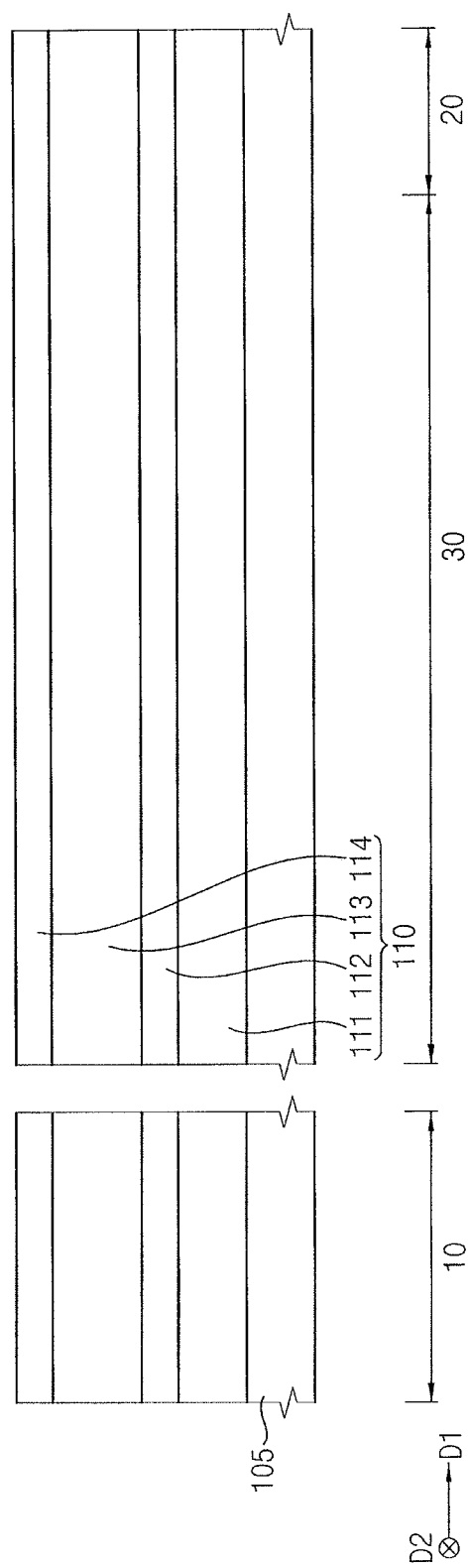
FIGS. 10 through 20 illustrate cross-sectional views of a method of manufacturing an OLED device in accordance with an example embodiment.

Referring to FIG. 10, a rigid glass substrate 105 may be provided. A first organic film layer 111 may be formed on the rigid glass substrate 105. The first organic film layer 111 may be formed on the entire rigid glass substrate 105, and may be formed using organic materials having flexibility such as polyimide.

A first barrier layer 112 may be formed on the entire first organic film layer 111. The first barrier layer 112 may block water and/or moisture that is permeated through the first organic film layer 111. The first barrier layer 112 may be formed using inorganic materials having flexibility such as silicon oxide, silicon nitride, etc. For example, the first barrier layer 112 may include SiO, SiN, SiON, SiOC, SiCN, AlO, AlN, TaO, HfO, ZrO, TiO, etc.

A second organic film layer 113 may be formed on the first barrier layer 112. The second organic film layer 113 may be formed on the entire first barrier layer 112, and may be formed using organic materials having flexibility such as polyimide.

A second barrier layer 114 may be formed on the entire second organic film layer 113. The second barrier layer 114 may block water and/or moisture that is permeated through the second organic film layer 113. The second barrier layer 114 may be formed using inorganic materials having flexibility such as SiO, S. N, etc.

Accordingly, a substrate 110 including the first organic film layer 111, the first barrier layer 112, the second organic film layer 113, and the second barrier layer 114 may be formed.

The substrate 110 may be relatively thin and flexible. Thus, the substrate 110 may be formed on a rigid glass substrate 105 to help support the formation of an upper structure (e.g., a semiconductor element and a light emitting structure, etc.). For example, after the upper structure is formed on the substrate 110, the rigid glass substrate 105 may be removed. It may not be straightforward to directly form the upper structure on the first and second organic film layers 111 and 113 and the first and second barrier layers 112 and 114 because the first and second organic film layers 111 and 113 and the first and second barrier layers 112 and 114 are relatively thin and flexible. Accordingly, the upper structure may be formed on the substrate 110 and the rigid glass substrate, and then the first and second organic film layers 111 and 113 and the first and second barrier layers 112 and 114 may serve as the substrate 110 after the removal of the rigid glass substrate 105.

A buffer layer may be formed on the substrate 110. The buffer layer may be formed on the entire substrate 110. The buffer layer may help prevent the diffusion of metal atoms and/or impurities from the substrate 110. In addition, the buffer layer may control a rate of a heat transfer in a crystallization process for forming an active layer, thereby obtaining substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may not be formed. For example, the buffer layer may be formed using organic materials or inorganic materials.

Figure 11:
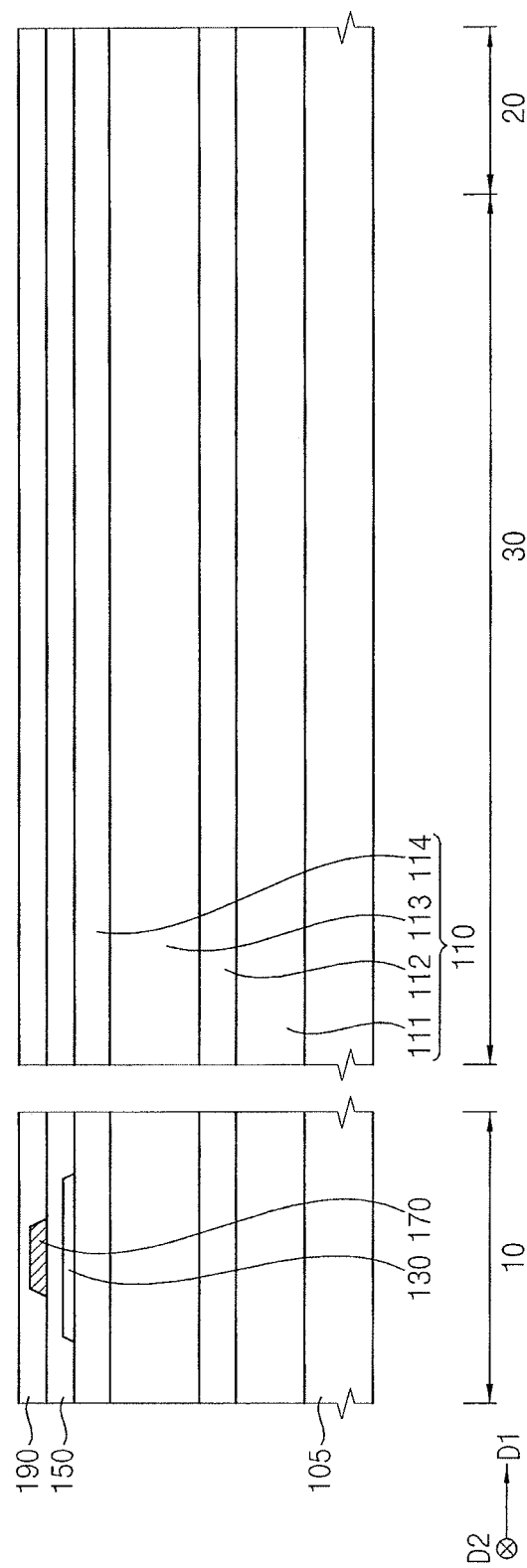

Referring to FIG. 11, an active layer 130 may be formed in a display region 10 on the substrate 110. The active layer 130 may be formed using an oxide semiconductor, an inorganic semiconductor, an organic semiconductor, etc. The active layer 130 may have a source region and a drain region.

A gate insulation layer 150 may be formed on the active layer 130. The gate insulation layer 150 may cover the active layer 130 in the display region 10 on the substrate 110, and may extend in a first direction 11l from the display region 10 into an opening region 20. Thus, the gate insulation layer 150 may be formed on the entire substrate 110. For example, the gate insulation layer 150 may sufficiently cover the active layer 130 on the substrate 110, and may have a substantially flat upper surface without a step around the active layer 130. In another implementation, the gate insulation layer 150 may cover the active layer 130 on the substrate 110, and may be formed with a substantially uniform thickness along a profile of the active layer 130. The gate insulation layer 150 may be formed using silicon compound, metal oxide, etc. In another implementation, the gate insulation layer 150 may have a multi-layered structure including a plurality of insulation layers. For example, the insulation layers may have different thicknesses to each other or include different materials to each other.

A gate electrode 170 may be formed in the display region 10 on the gate insulation layer 150. The gate electrode 170 may be formed on a portion of the gate insulation layer 150 under which the active layer 130 is located. The gate electrode 170 may be formed using a metal, a metal alloy, metal nitride, conductive metal oxide, transparent conductive materials, etc. These may be used alone or in a suitable combination thereof. In another implementation, the gate electrode 170 may have a multi-layered structure including a plurality of layers.

An insulating interlayer may be formed on the gate electrode 170. The insulating interlayer 190 may cover the gate electrode 170 in the display region 10 on the gate insulation layer 150, and may extend in the first direction D1. Thus, the insulating interlayer 190 may be formed on the entire gate insulation layer 150. For example, the insulating interlayer 190 may sufficiently cover the gate electrode 170 on the gate insulation layer 150, and may have a substantially flat upper surface without a step around the gate electrode 170. In another implementation, the insulating interlayer 190 may cover the gate electrode 170 on the gate insulation layer 150, and may be formed with a substantially uniform thickness along a profile of the gate electrode 170. The insulating interlayer 190 may be formed using silicon compound, metal oxide, etc. In an example embodiment, the insulating interlayer 190 may have a multi-layered structure including a plurality of insulation layers. The insulation layers may have different thicknesses to each other or include different materials to each other.

Figure 12:
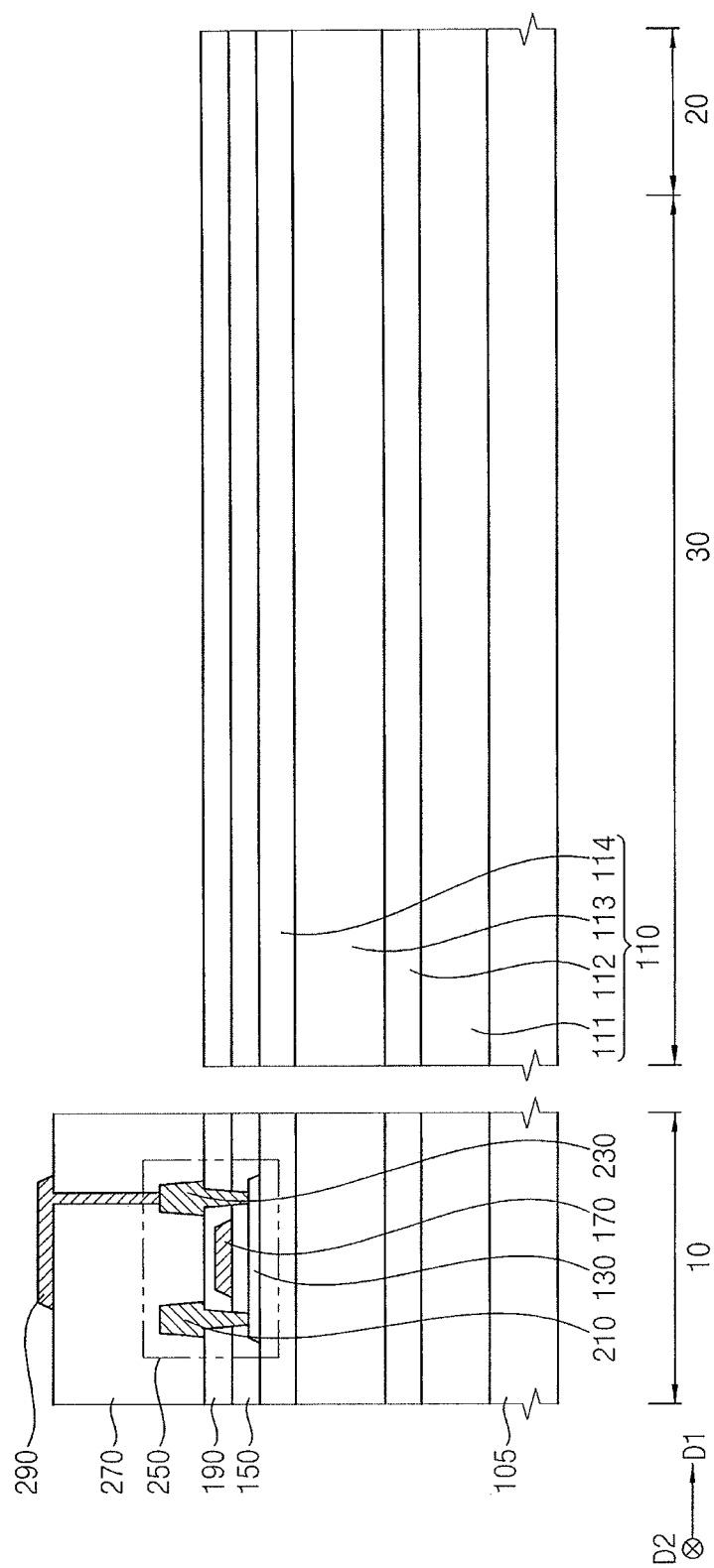

Referring to FIG. 12, a source electrode 210 and a drain electrode 230 may be formed in the display region 10 on the insulating interlayer 190. The source electrode 210 may be connected to the source region of the active layer 130 via a contact hole formed by removing a first portion of the gate insulation layer 150 and the insulating interlayer 190. The drain electrode 230 may be connected to the drain region of the active layer 130 via a contact hole formed by removing a second portion of the gate insulation layer 150 and the insulating interlayer 190. Each of the source electrode 210 and the drain electrode 230 may include a metal, an alloy, metal nitride, conductive metal oxide, transparent conductive materials, etc. These may be used alone or in a suitable combination thereof. In an example embodiment, each of the source and drain electrodes 210 and 230 may have a multi-layered structure including a plurality of layers. Accordingly, a semiconductor element 250 including the active layer 130, the gate insulation layer 150, the gate electrode 170, the insulating interlayer 190, the source electrode 210, and the drain electrode 230 may be formed.

A planarization layer 270 may be formed on the insulating interlayer 190, the source electrode 210, and the drain electrode 230. The planarization layer 270 may cover the source and drain electrodes 210 and 230 in the display region 10 on the insulating interlayer 190, and may not be formed in the peripheral region 30. Thus, the planarization layer 270 may be formed only in the display region 10 on the insulating interlayer 190. For example, the planarization layer 270 may be formed with a relatively high thickness in the display region 10. In this case, the planarization layer 270 may have a substantially flat upper surface, and a planarization process may be further performed on the planarization layer 270 to implement the flat upper surface of the planarization layer 270. In another implementation, the planarization layer 270 may be formed with a substantially uniform thickness along a profile of the source and drain electrodes 210 and 230 in the display region 10 on the insulating interlayer 190. The planarization layer 270 may be formed using organic materials.

A lower electrode 290 may be formed in the display region 10 on the planarization layer 270. The lower electrode 290 may be connected to the drain electrode 230 via a contact hole formed by removing a portion of the planarization layer 270. In addition, the lower electrode 290 may be electrically connected to the semiconductor element 250. The lower electrode 290 may be formed using a metal, a metal alloy, metal nitride, conductive metal oxide, transparent conductive materials, etc. These may be used alone or in a suitable combination thereof. In an example embodiment, the lower electrode 290 may have a multi-layered structure including a plurality of layers.

Figure 13:
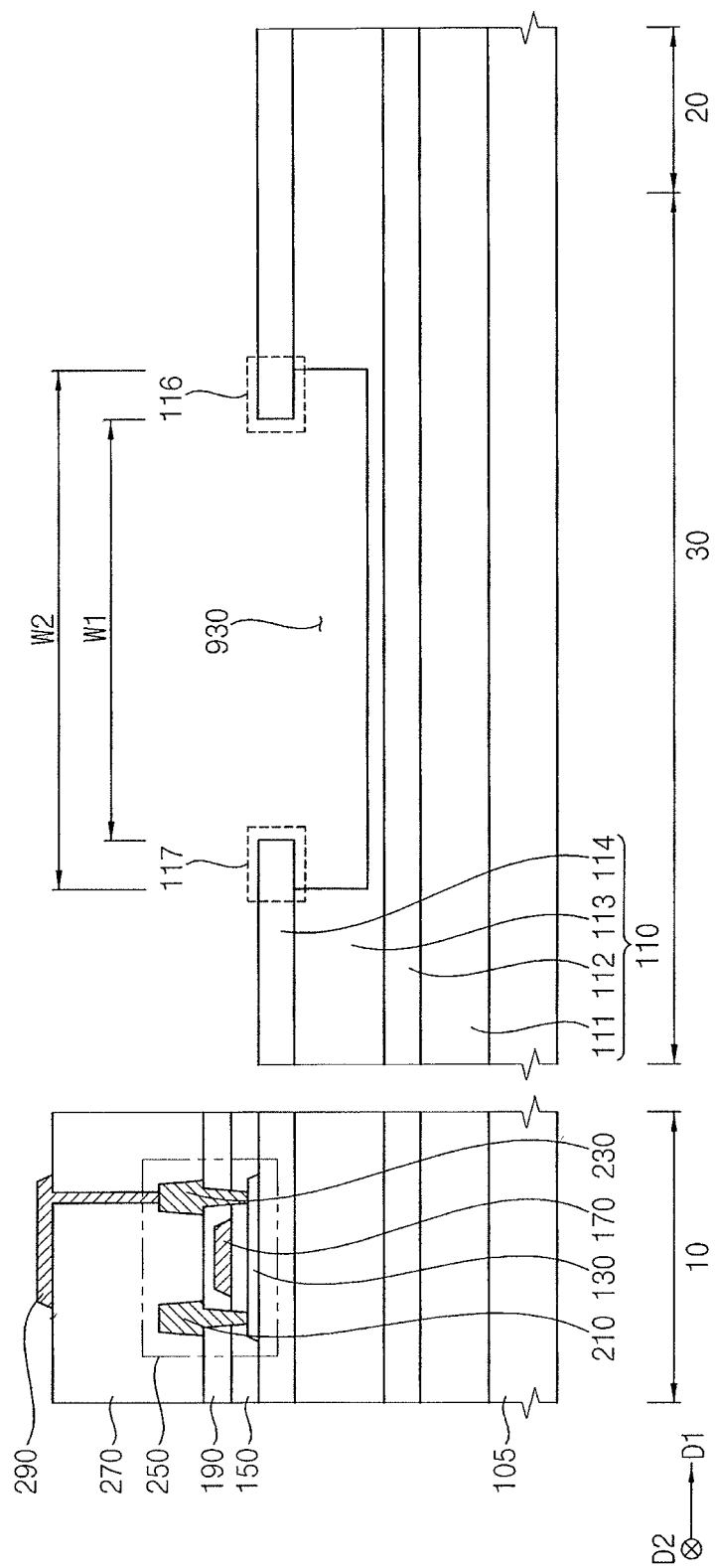

Referring to FIG. 13, after the lower electrode 290 is formed, the gate insulation layer 150 and the insulating interlayer 190 that are located in a peripheral region 30 may be removed. After the gate insulation layer 150 and the insulating interlayer 190 that are located in the peripheral region 30 are removed, a groove 930 having an enlarged lower portion may be formed in the substrate 110 located in the peripheral region 30 through a laser or a dry etching process. The groove 930 may have an under-cut shape. For example, a trench, which has a second width W2, formed in the second organic film layer 113 and an opening, which has a first width W1 that is less than the second width W2, formed in the second barrier layer 114 may be defined as the under-cut shape. In another implementation, an opening, which has a second width W1 formed in the second organic film layer 113 and an opening, which has a first width W1 that is less than the second width W2, formed in the second barrier layer 114 may be defined as the under-cut shape. In this case, an upper surface of the first barrier layer 112 may be exposed through the opening of the second organic film layer 113.

First and second protruded portions 116 and 117 that protrude in an inner portion of the trench on the trench of the second organic film layer 113 may be defined by the opening of the second barrier layer 114. For example, the first protruded portion 116 may be located adjacent to a boundary of the peripheral region 30 and the opening region 20. The second protruded portion 117 may face the first protruded portion 116, and may be spaced apart from the first protruded portion 116. In addition, a space located under each of the first and second protruded portions 116 and 117 may be defined as first and second spaces 118 and 119 (refer to FIG. 14). Accordingly, the trench of the second organic film layer 113, the first and second protruded portions 116 and 117 of the second barrier layer 114, and the opening of the second barrier layer 114 may be defined as the groove 930, which has the enlarged lower portion, formed in the substrate 110 located in the peripheral region 30. In an example embodiment, a plurality of grooves may be formed to be spaced apart from the groove 930 by the first direction D1, and may be formed to be spaced apart from the groove 930 by a direction that is opposite to the first direction D1.

Figure 14:
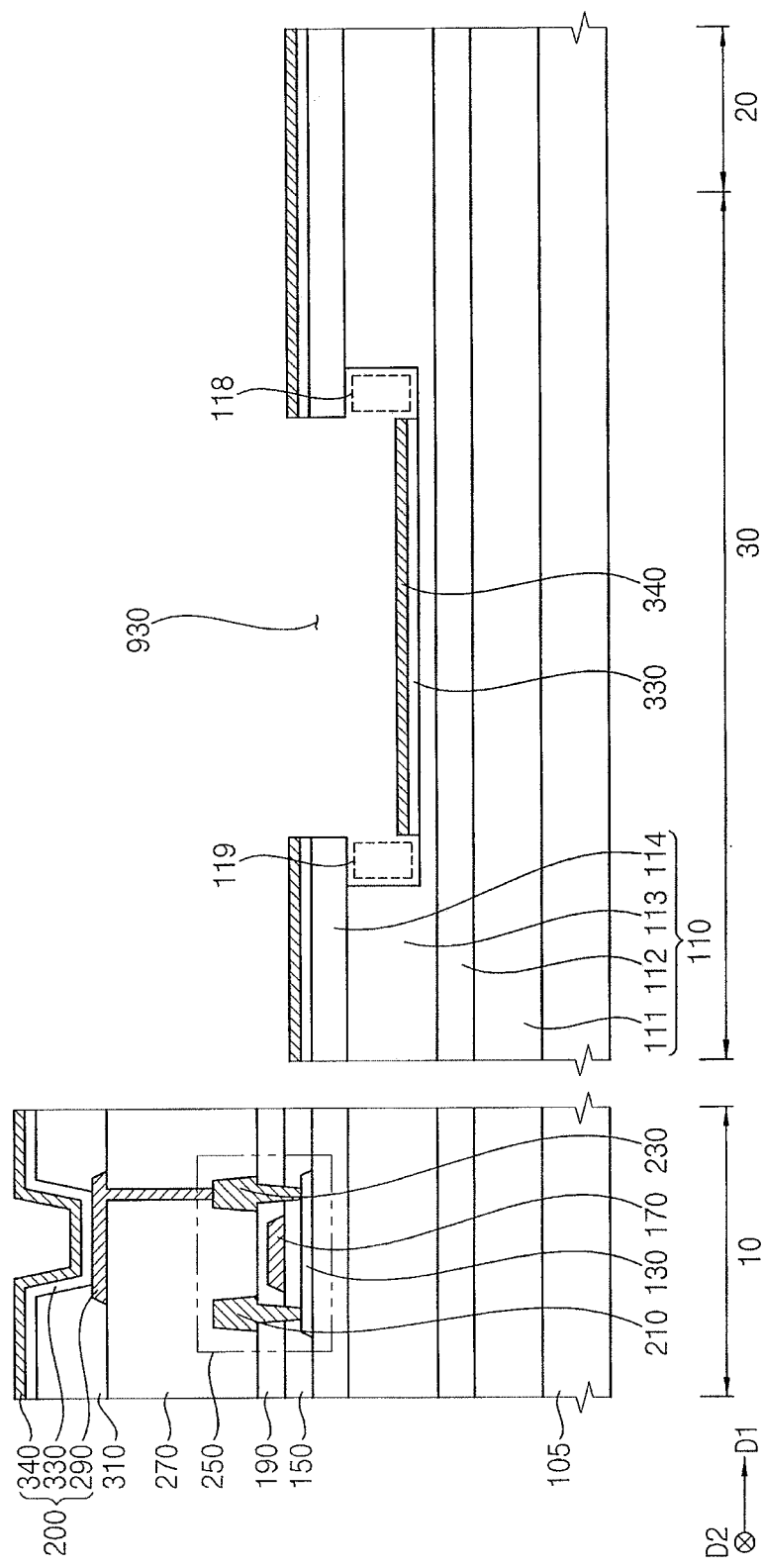

Referring to FIG. 14, a pixel defining layer 310 may be formed in the display region 10 on the planarization layer 270, and may not be formed in the peripheral region 30. Thus, the pixel defining layer 310 may be formed only in the display region 10. For example, the pixel defining layer 310 may cover both lateral portions of the lower electrode 290, and may expose a portion of an upper surface of the lower electrode 290. The pixel defining layer 310 may be formed using organic materials.

A light emitting layer 330 may be formed on the lower electrode 290 and the pixel defining layer 310 in the display region 10 and extend in the first direction D1, and may be formed in the peripheral region 30. In an example embodiment, the light emitting layer 330 may be partially formed in an inner portion of the groove 930, and the light emitting layer 330 in a portion where the groove 930 is located may be separated in a depth direction. Thus, the light emitting layer 330 may be separated in the peripheral region 30. Thus, the light emitting layer 330 may be separated in the peripheral region 30 by the first and second spaces 118 and 119.

The light emitting layer 330 may have a multi-layered structure including an EML, an HIL, an HTL, an ETL, an EIL, etc. In an example embodiment, the EML, the HIL, the HTL, the ETL, and the EIL may be formed in the peripheral region 30. In an example embodiment, the HIL, the HTL, the ETL, and the EIL except for the EML may be formed in the peripheral region 30.

The EML of the light emitting layer 330 may be formed using at least one of light emitting materials capable of generating different colors of light (e.g., a red color of light, a blue color of light, and a green color of light, etc.) according to sub-pixels. In another implementation, the EML of the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330 that is formed on the lower electrode 290. The color filter may include at least one selected from a red color filter, a green color filter, and a blue color filter. In another implementation, the color filter may include a yellow color filter, a cyan color filter, and a magenta color filter. The color filter may be formed using a photosensitive resin, a color photoresist, etc.

An upper electrode 340 may be formed on the light emitting layer 330. The upper electrode 340 may be formed to overlap the light emitting layer 330 in the display region 10 and extend in the first direction D1, and may be formed in the peripheral region 30 on the light emitting layer 330. In an example embodiment, the upper electrode 340 may be partially formed in the inner portion of the groove 930, and the upper electrode 340 in a portion where the groove 930 is located may be separated in the depth direction. Thus, the upper electrode 340 may be separated in the peripheral region 30. Thus, the upper electrode 340 may be separated in the peripheral region 30 by the first and second spaces 118 and 119.

The upper electrode 340 may be formed using a metal, a metal alloy, metal nitride, conductive metal oxide, transparent conductive materials, etc. These may be used alone or in a suitable combination thereof. In an example embodiment, the upper electrode 340 may have a multi-layered structure including a plurality of layers.

Accordingly, a light emitting structure 200 including the lower electrode 290, the light emitting layer 330, and the upper electrode 340 may be formed.

Figure 15:
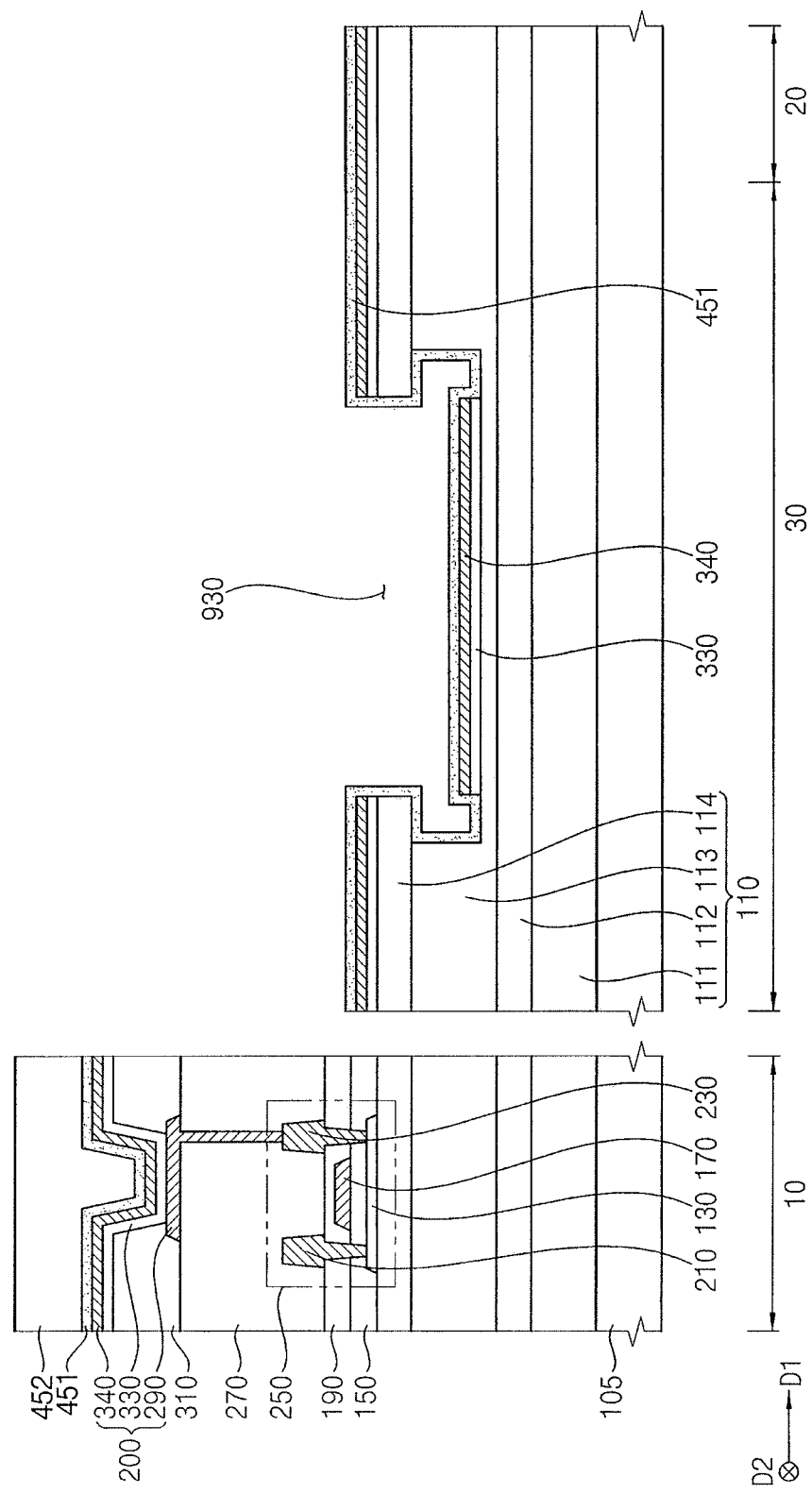

Referring to FIG. 15, a capping layer may be formed on the upper electrode 340. The capping layer may be formed to overlap the upper electrode 340 in the display region 10 and extend in the first direction D1, and may be formed in the peripheral region 30 on the upper electrode 340. In an example embodiment, the capping layer may be partially formed in the inner portion of the groove 930, and the capping layer in a portion where the groove 930 is located may be separated in the depth direction. Thus, the capping layer may be separated in the peripheral region 30. Thus, the capping layer may be separated in the peripheral region 30 by the first and second spaces 118 and 119. The capping layer may protect the light emitting structure 200, and may be formed using organic materials such as a triamine derivative, arylenediamine derivative, CBP, Alq3, etc.

A first TFE layer 451 may be formed in the display region 10 and the peripheral region 30 on the upper electrode 340. The first TFE layer 451 may cover the upper electrode 340 in the display region 10, and may be formed with a substantially uniform thickness along a profile of the upper electrode 340 and may extend in the peripheral region 30. The first TFE layer 451 may be formed along a profile of the upper electrode 340 in the peripheral region 30. Thus, the first TFE layer 451 may be continuously formed in a portion where the groove 930 is formed. In an example embodiment, the first TFE layer 451 may completely cover the groove 930. Thus, the first TFE layer 451 may cover the first and second protruded portions 116 and 117, and may be formed in the first and second spaces 118 and 119 and completely cover the light emitting layer 330 and the upper electrode 340 that are formed inside the groove 930. Thus, the first TFE layer 451 may be in direct contact with the second organic film layer 113 in the first and second spaces 118 and 119. The first TFE layer 451 may help prevent the light emitting structure 200 from being deteriorated by the permeation of moisture, water, oxygen, etc. In addition, the first TFE layer 451 may protect the light emitting structure 200 from external impacts. The first TFE layer 451 may be formed using inorganic materials having flexibility.

A second TFE layer 452 may be formed in the display region 10 on the first TFE layer 451, and may not be formed in the peripheral region 30. Thus, the second TFE layer 452 may be formed only in the display region 10. The second TFE layer 452 may improve the flatness of the OLED device 100, and may protect the light emitting structure 200. The second TFE layer 452 may be formed using organic materials having the flexibility.

Figure 16:
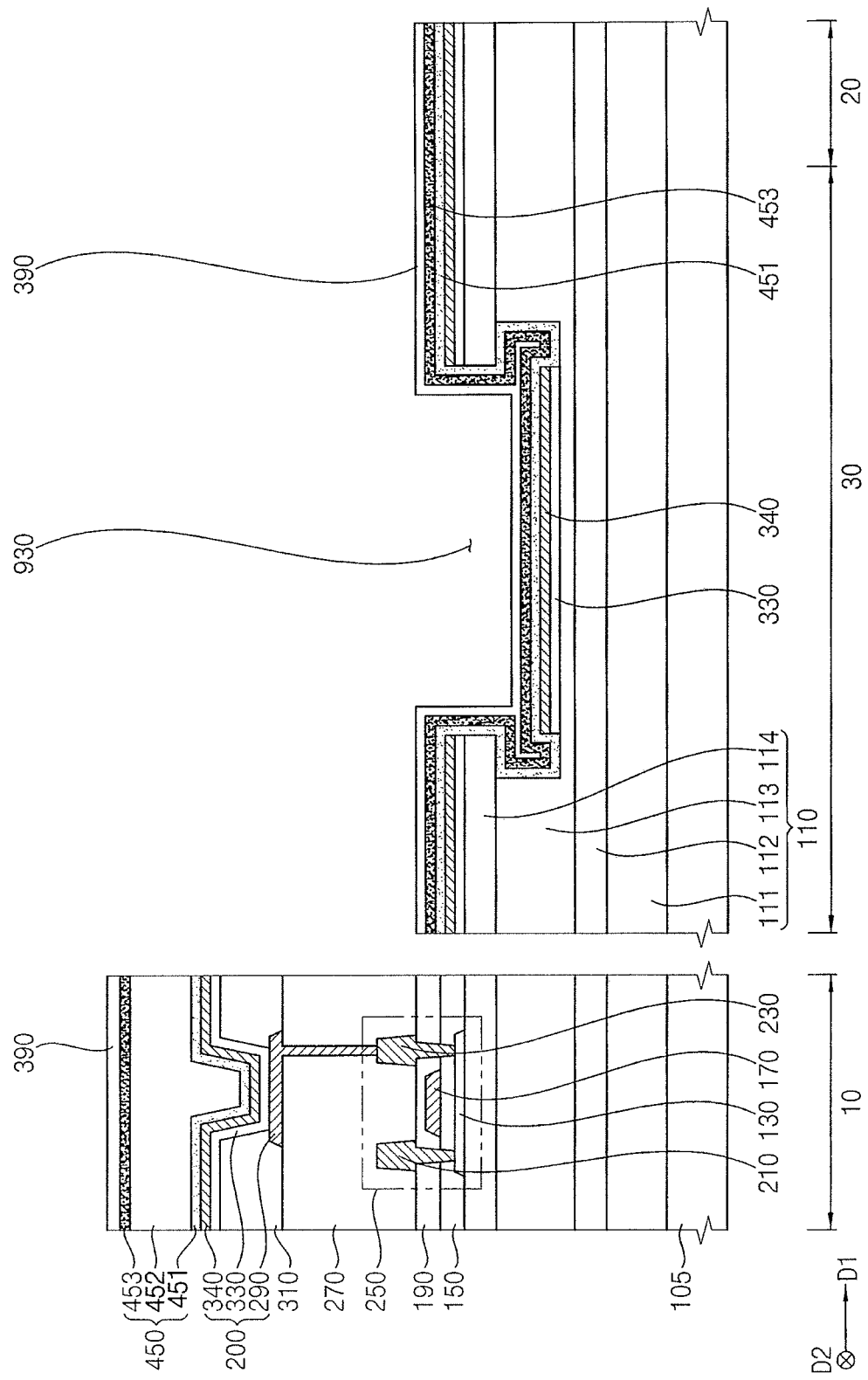

Referring to FIG. 16, a third TFE layer 453 may be formed in the display region 10 on the second TFE layer 452 and in the peripheral region 30 on the first TFE layer 451. The third TFE layer 453 may cover the second TFE layer 452 in the display region 10, and may be formed with a substantially uniform thickness along a profile of the second TFE layer 452 and may extend in the peripheral region 30. The third TFE layer 453 may be formed with a substantially uniform thickness along a profile of the first TFE layer 451 in the peripheral region 30. Thus, the third TFE layer 453 may be continuously formed in a portion where the groove 930 is formed. The third TFE layer 453 together with the first TFE layer 451 may help prevent the light emitting structure 200 from being deteriorated by the permeation of moisture, water, oxygen, etc. In addition, the third TFE layer 453 together with the first and second TFE layers 451 and 452 may protect the light emitting structure 200 from external impacts. The third TFE layer 453 may be formed using inorganic materials having the flexibility.

Accordingly, a TFE structure 450 including the first TFE layer 451, the second TFE layer 452, and the third TFE layer 453 may be formed. In another implementation, the TFE structure 450 may have five layers structure where first to fifth TFE layers are stacked or seven layers structure where first to seventh TFE layers are stacked.

A first insulation layer 390 may be formed in the display region 10 and the peripheral region 30 on the third TFE layer 453. The first insulation layer 390 may cover the third TFE layer 453 in the display region 10, and may be formed with a substantially uniform thickness along a profile of the third TFE layer 453 and may extend in the peripheral region 30. The first insulation layer 390 may be formed with a substantially uniform thickness along a profile of the third TFE layer 453 in the peripheral region 30. Thus, the first insulation layer 390 may be continuously formed in a portion where the first insulation layer 390 is formed. The first insulation layer 390 may be formed using organic materials or inorganic materials. In another implementation, the first insulation layer 390 may have a multi-layered structure including a plurality of insulation layers. For example, the insulation layers may have different thicknesses to each other or include different materials to each other.

Figure 17:
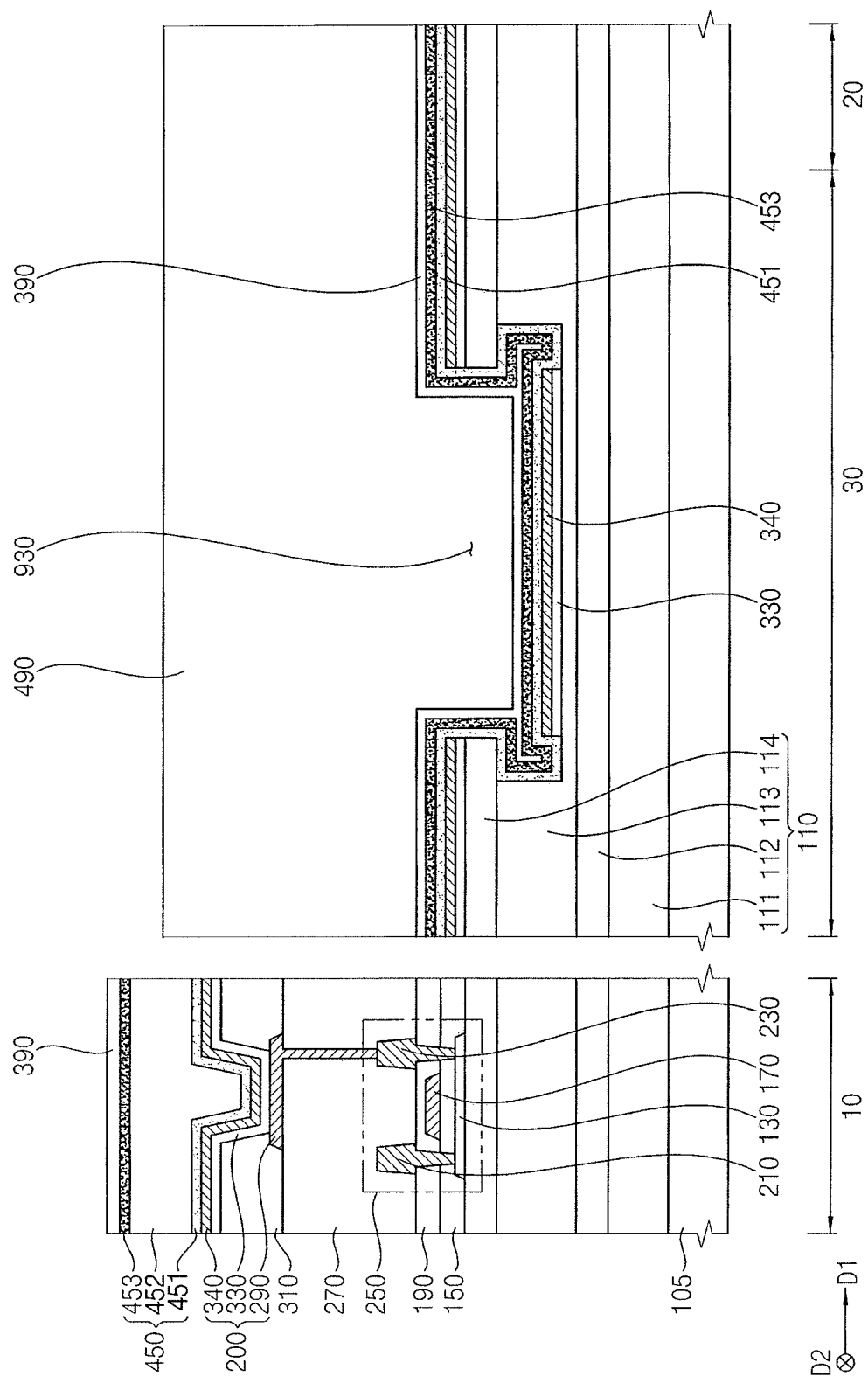

Referring to FIG. 17, an organic insulation pattern 490 may be formed in the peripheral region 30 on the first insulation layer 390. In an example embodiment, the organic insulation pattern 490 may be formed only in the peripheral region 30. The organic insulation pattern 490 may be formed with a relatively high thickness in the peripheral region 30 on the first insulation layer 390. In this case, the organic insulation pattern 490 may have a substantially flat upper surface, and a planarization process may be further performed on the organic insulation pattern 490 to implement the flat upper surface of the organic insulation pattern 490. In another implementation, the organic insulation pattern 490 may be formed with a substantially uniform thickness along a profile of the first insulation layer 390 in the display region 10 on the first insulation layer 390. The organic insulation pattern 490 may be formed using organic materials such as a photoresist, a polyacryl-based resin), a polyimide-based resin, a polyamide-based resin, a siloxane-based resin, an acryl-based resin, an epoxy-based resin.

Figure 18:
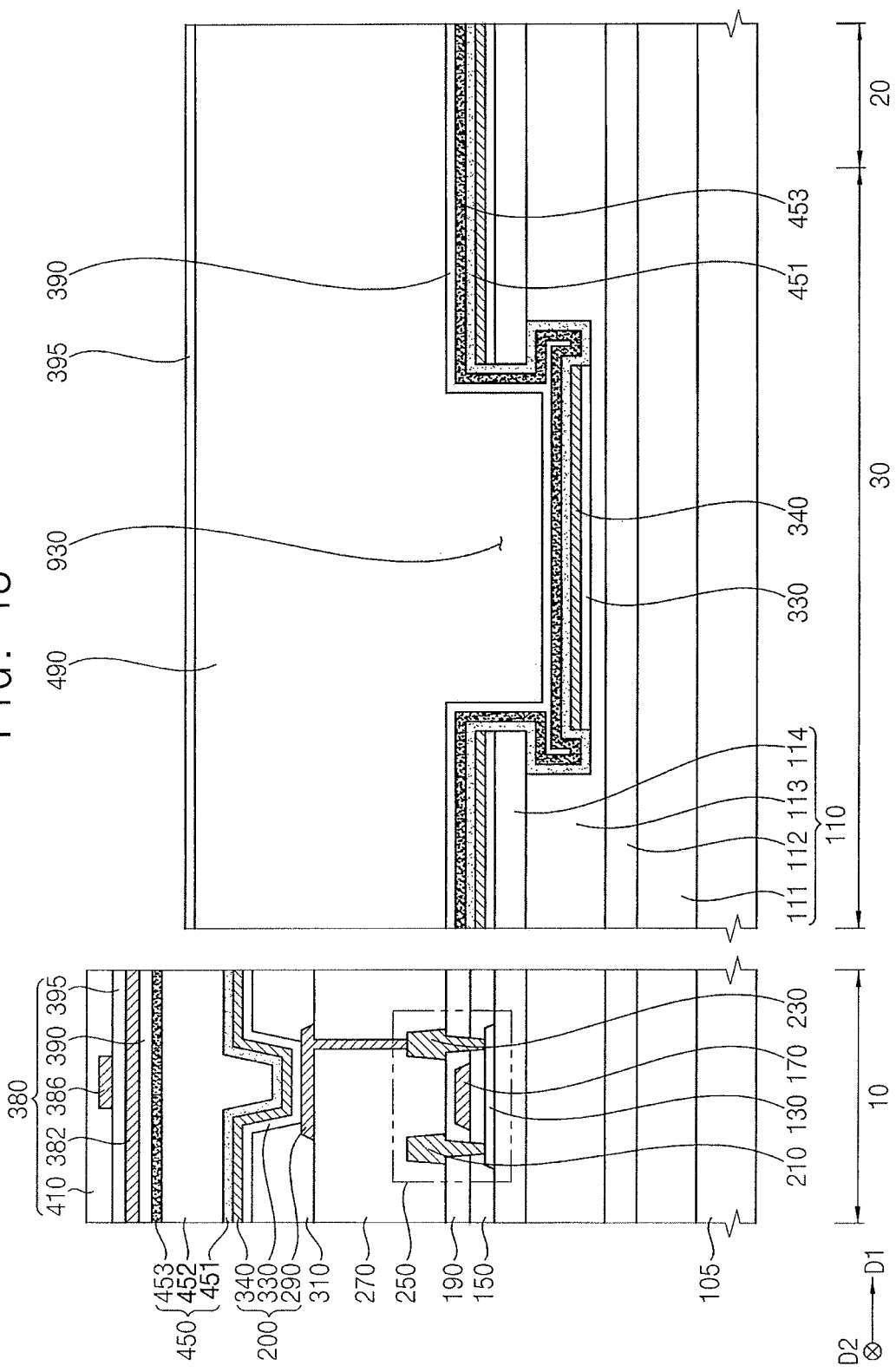

Referring to FIG. 18, first touch screen electrodes 382 and second touch screen electrodes 384 may be formed in the display region 10 on the first insulation layer 390 (refer to FIG. 9). Each of the first touch screen electrodes 382 may extend in the second direction D2, and may be spaced apart from each other by the first direction D1. The second touch screen electrodes 384 may be spaced apart from each other in the second direction D2 between adjacent two first touch screen electrodes 382 among the first touch screen electrodes 382. For example, each of the first and second touch screen electrodes 382 and 384 may be formed using a carbon nano-tube (CNT), transparent conductive oxide, ITO, indium gallium zinc oxide (IGZO), ZnO, a graphene, Ag nanowire (AgNW), Cu, Cr, etc.

A second insulation layer 395 may be formed in the display region 10 on the first and second touch screen electrodes 382 and 384. The second insulation layer 395 may cover the first and second touch screen electrodes 382 and 384 in the display region 10, and may be formed with a substantially uniform thickness along a profile of the first and second touch screen electrodes 382 and 384 and may extend in the peripheral region 30. The second insulation layer 395 may be formed along a profile of the organic insulation pattern 490 in the peripheral region 30. Thus, the second insulation layer 395 may be in contact with an upper surface of the first insulation layer 390 in the display region 10, and may be in contact with an upper surface of the organic insulation pattern 490 in the peripheral region 30. The second insulation layer 395 may be formed using organic materials or inorganic materials. In another implementation, the second insulation layer 395 may have a multi-layered structure including a plurality of insulation layers. The insulation layers may have different thicknesses to each other or include different materials to each other.

Figure 19:
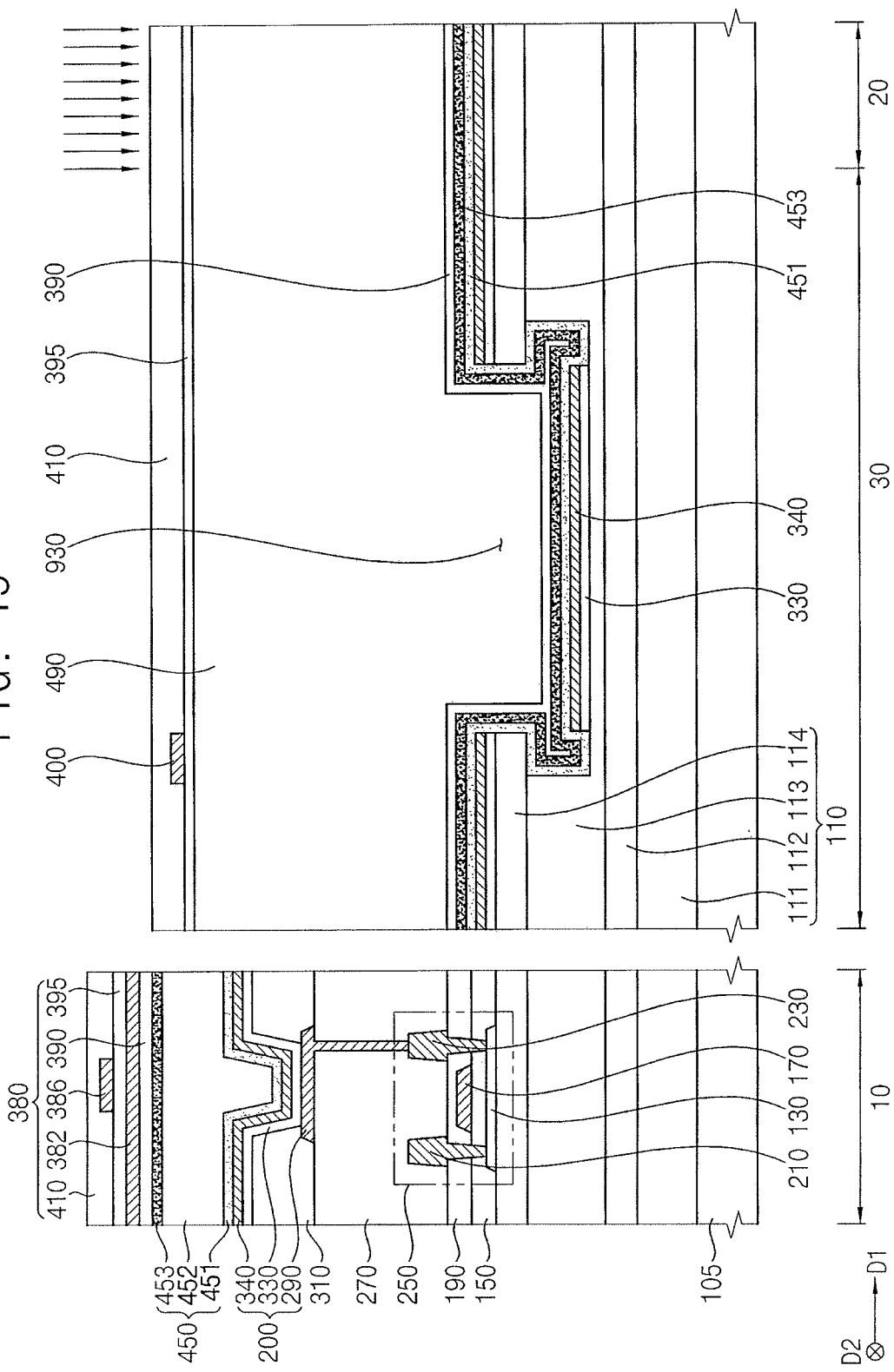

Referring to FIG. 19, touch screen connection electrodes 386 may be formed in the display region 10 on the second insulation layer 395 (refer to FIG. 9). The touch screen connection electrodes 386 may electrically connect adjacent two second touch screen electrodes 384 in the first direction D1 among the second touch screen electrodes 384 through a contact hole. For example, the touch screen connection electrodes 386 and the first and second touch screen electrodes 382 and 384 may be formed using same materials. In another implementation, the touch screen connection electrodes 386 may be formed using a metal, an alloy of a metal, metal nitride, conductive metal oxide, transparent conductive materials, etc. These may be used alone or in a suitable combination thereof.

A conductive pattern 400 may be formed in the peripheral region 30 on the second insulation layer 395. In an example embodiment, to detect a damage of the second protruded portion 117, the conductive pattern 400 may be formed to overlap the second protruded portion 117 of the groove 930. In another implementation, the conductive pattern 400 may be formed to overlap the first protruded portion 116 of the groove 930.

For example, the conductive pattern 400 on the groove 930 may be formed along a profile of the second protruded portion 117 of the groove 930. The conductive pattern 400 may substantially surround the opening region 20. The conductive pattern 400 may include a first sub-conductive pattern 401 and second sub-conductive patterns 402 (refer to FIG. 6). The first sub-conductive pattern 401 may have a plan shape of a partially opened circle including an open portion, and the second sub-conductive patterns 402 may extend from the open portion of the first sub-conductive pattern 401 in the second direction D2. In an example embodiment, the first sub-conductive pattern 401 and the second sub-conductive patterns 402 may be integrally formed at a same layer.

In another implementation, the first sub-conductive pattern 401 may be formed on the second sub-conductive patterns 402, and the open portion of the first sub-conductive pattern 401 may be connected to a distal end of the second sub-conductive patterns 402 through a contact hole. Otherwise, the second sub-conductive patterns 402 may be formed on the first sub-conductive pattern 401, and the open portion of the first sub-conductive pattern 401 may be connected to a distal end of the second sub-conductive patterns 402 through a contact hole.

The first sub-conductive pattern 401 may be formed to overlap the groove 930. For example, the first sub-conductive pattern 401 may be formed to overlap the second protruded portion 117 of the groove 930. In another implementation, the first sub-conductive pattern 401 may overlap the first protruded portion 116 of the groove 930.

The conductive pattern 400 and the touch screen connection electrodes 386 may be simultaneously formed using same materials. In another implementation, the conductive pattern 400 and the first and second touch screen electrodes 382 and 384 may be simultaneously formed using same materials.

A protective insulation layer 410 may be formed in the display region 10 and the peripheral region 30 on the second insulation layer 395, the touch screen connection electrodes 386, and the conductive pattern 400. The protective insulation layer 410 may be formed with a relatively high thickness on the second insulation layer 395. In this case, the protective insulation layer 410 may have a substantially flat upper surface. In another implementation, the protective insulation layer 410 may cover the touch screen connection electrodes 386 and the conductive pattern 400 in the display region 10 and the peripheral region 30 on the second insulation layer 395, and may be formed with a substantially uniform thickness along a profile of the touch screen connection electrodes 386 and the conductive pattern 400. The protective insulation layer 410 may be formed using organic materials.

As described above, a touch screen structure 380 including the first insulation layer 390, the first touch screen electrodes 382, the second touch screen electrodes 384, the second insulation layer 395, the touch screen connection electrodes 386, and the protective insulation layer 410 may be formed.

After the touch screen structure 380 is formed, a laser may be irradiated in the opening region 20 on the protective insulation layer 410. In another implementation, a different etching process may be performed to expose the opening region 20 on the protective insulation layer 410.

Figure 20:
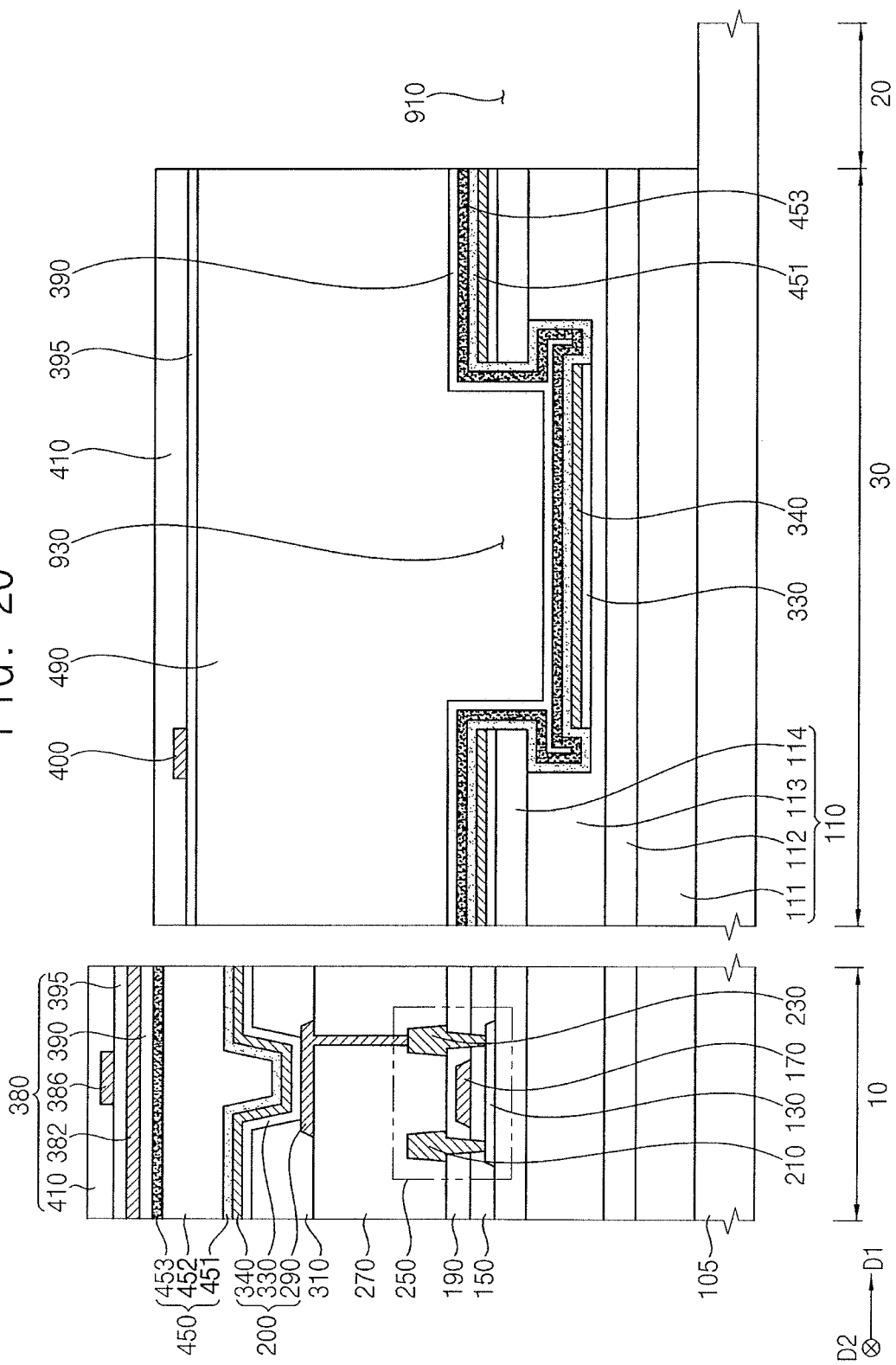

Referring to FIGS. 20 and 6, an opening 910 may be formed in the opening region 20 through the laser irradiation, and a functional module 700 may be formed in the opening 910. In an example embodiment, the functional module 700 may be in contact with a side surface of the substrate 110, a side surface of the light emitting layer 330, a side surface of the upper electrode 340, a side surface of the first TFE layer 451, a side surface of the third TFE layer 453, a side surface of the first insulation layer 390, a side surface of the organic insulation pattern 490, a side surface of the second insulation layer 395, and a side surface of the protective insulation layer 410 in a boundary of the peripheral region 30 and the opening region 20. For example, the functional module 700 may include a camera module, a face recognition sensor module, a pupil recognition sensor module, acceleration and geomagnetic sensor modules, proximity and infrared sensor modules, and a light intensity sensor module, etc. After the functional module 700 is formed, the rigid glass substrate 105 may be removed from the substrate 110. Accordingly, the OLED device 100 illustrated in FIG. 6 may be manufactured.

Figure 21:
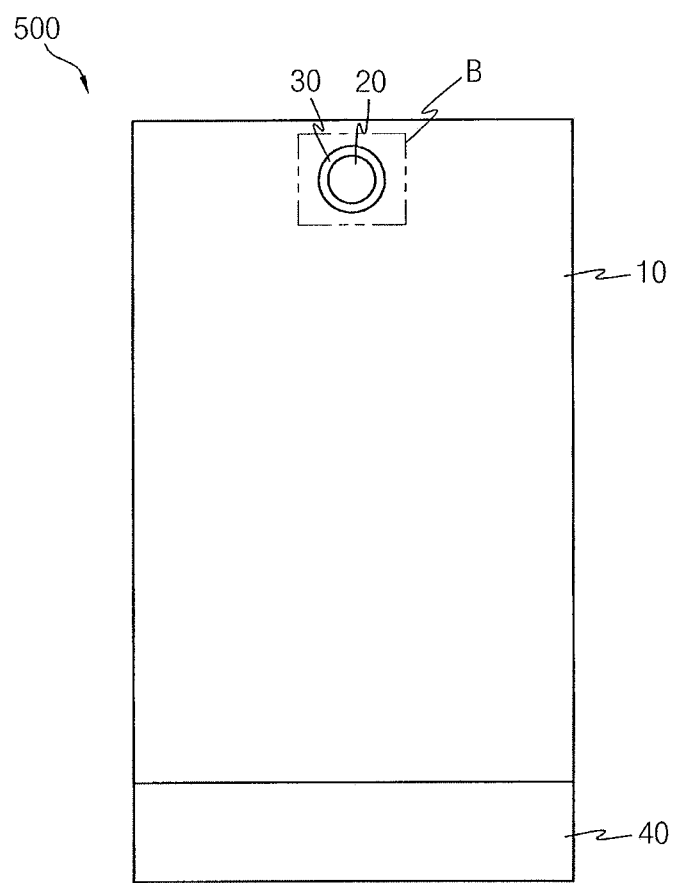
FIG. 21 illustrates a plan view of an OLED device in accordance with an example embodiment.
Figure 22:
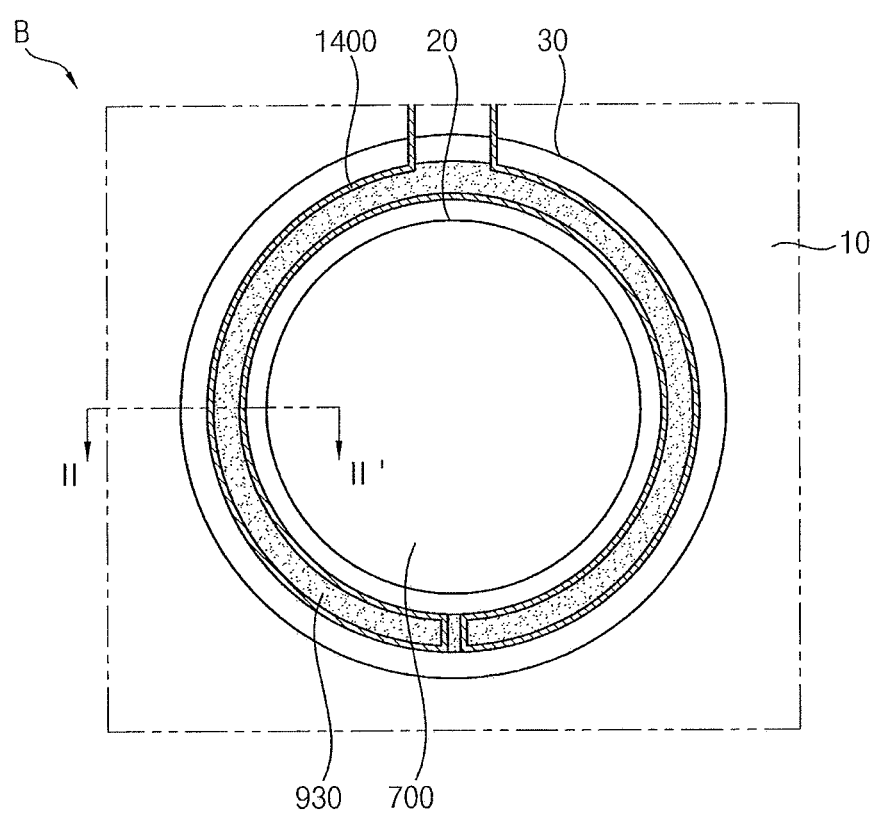
FIG. 22 illustrates a partially enlarged plan view corresponding to region '13' of FIG. 21.
Figure 23:
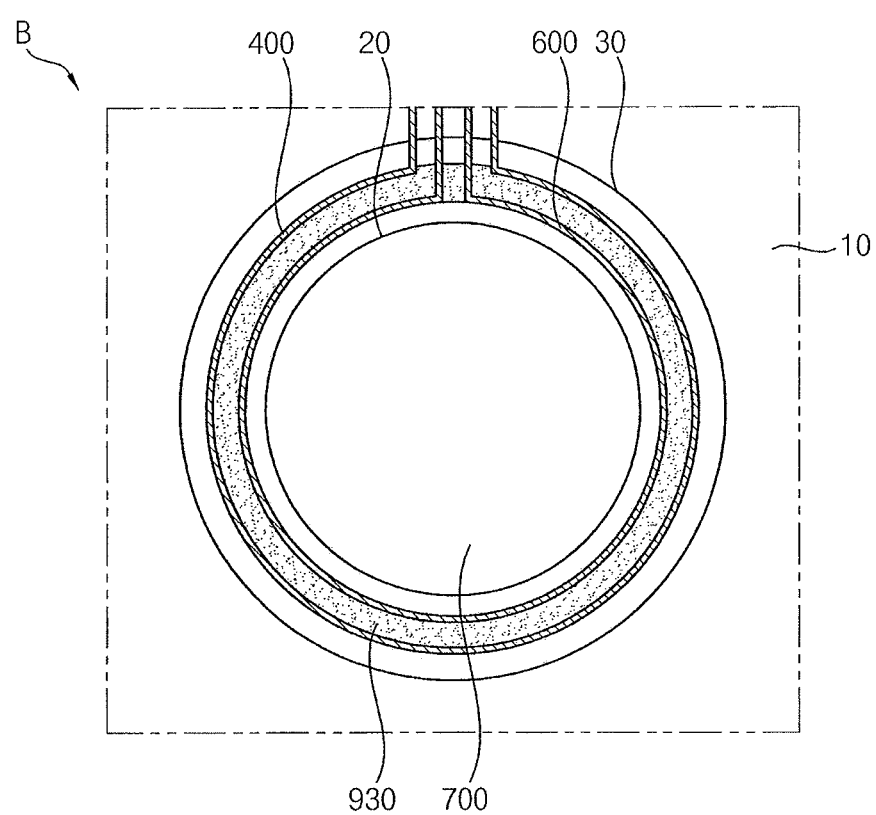
FIG. 23 illustrates a partially enlarged plan view of an example of a conductive pattern included in the OLED device of FIG. 22.
Figure 24:
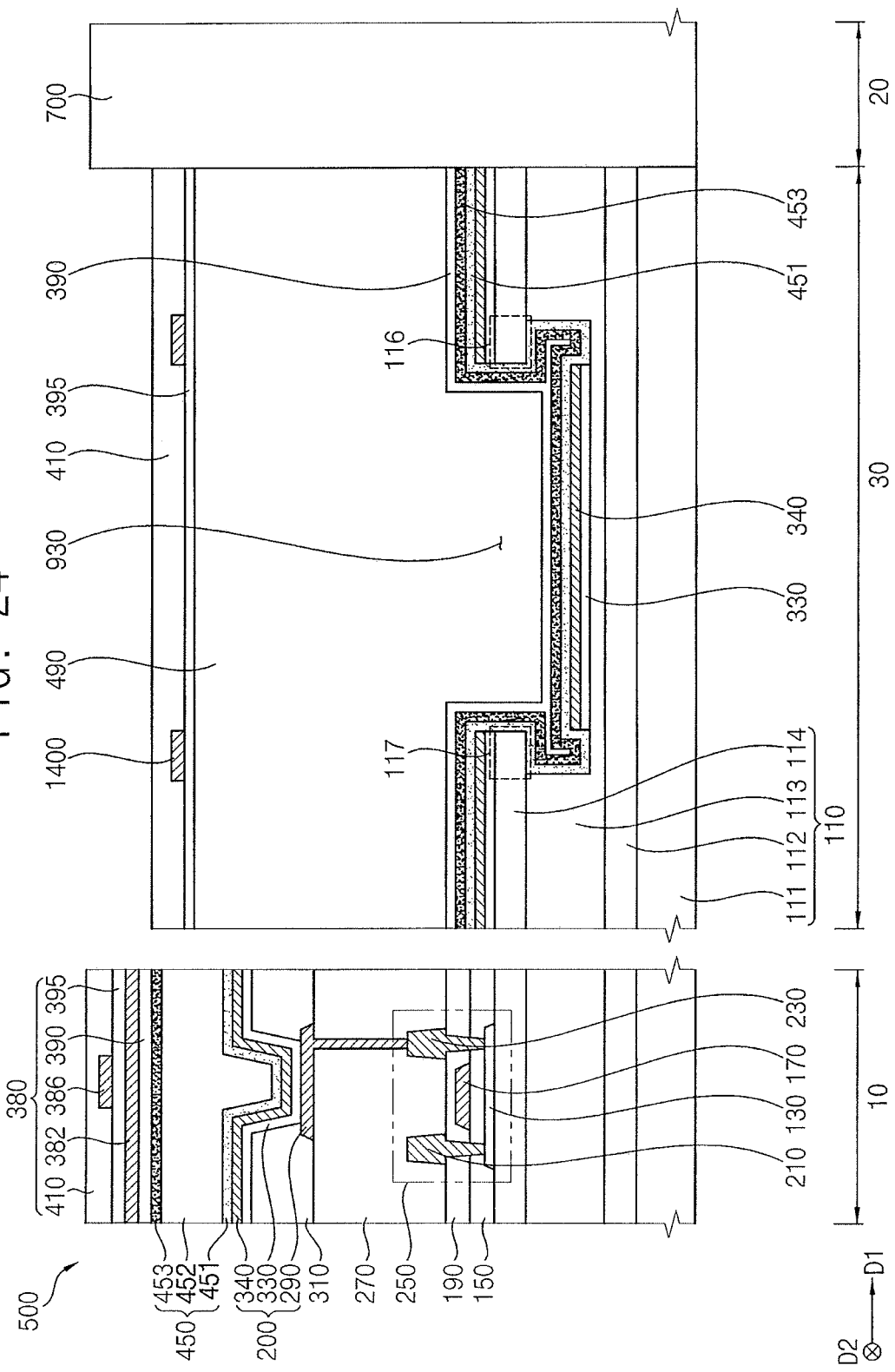
FIG. 24 illustrates a cross-sectional view taken along lines I-I' of FIG. 22.

FIG. 21 is a plan view illustrating an OLED device in accordance with an example embodiment, and FIG. 22 is a partially enlarged plan view corresponding to region '13' of FIG. 21. FIG. 23 is a partially enlarged plan view illustrating an example of a conductive pattern included in the OLED device of FIG. 22, and FIG. 24 is a cross-sectional view taken along lines I-I' of FIG. 22. An OLED device 500 illustrated in FIGS. 21, 22, and 24 may have a configuration substantially the same as or similar to that of an OLED device 100 described with reference to FIGS. 1 through 9 except for a conductive pattern 1400. In FIGS. 21, 22, and 24, detailed descriptions for elements that are substantially the same as or similar to elements described with reference to FIGS. 1 through 9 may not be repeated.

Referring to FIGS. 21, 22, and 24, the OLED device 500 may include a substrate 110, a semiconductor element 250, a planarization layer 270, a light emitting structure 200, a pixel defining layer 310, a TFE structure 450, a touch screen structure 380, an organic insulation pattern 490, a conductive pattern 1400, a functional module 700, etc. The substrate 110 may include a first organic film layer 111, a first barrier layer 112, a second organic film layer 113, and a second barrier layer 114. As the OLED device 500 has the display region 10, the opening region 20, the peripheral region 30, and the pad region 40, the substrate 110 may be divided into the display region 10, the opening region 20, the peripheral region 30, and the pad region 40. In addition, the touch screen structure 380 may include a first insulation layer 390, a plurality of first touch screen electrodes 382, a plurality of second touch screen electrodes 384, a plurality of touch screen connection electrodes 386, a second insulation layer 395, and a protective insulation layer 410.

The conductive pattern 1400 may be in the peripheral region 30 on the second insulation layer 395. In an example embodiment, to detect a damage of the first and second protruded portions 116 and 117, the conductive pattern 1400 may overlap the first and second protruded portions 116 and 117 of the groove 930.

For example, the conductive pattern 1400 on the groove 930 may be disposed along a profile of the first and second protruded portions 116 and 117 of the groove 930. As illustrated in FIG. 22, the conductive pattern 1400 may include a first sub-conductive pattern, second sub-conductive pattern, a third sub-conductive patterns, and a fourth sub-conductive pattern. The first sub-conductive pattern may have a plan shape of a partially opened circle including top and bottom open portions, and may overlap the second protruded portion 117 of the groove 930. The second sub-conductive pattern may have a plan shape of a partially opened circle including a bottom open portion, and may overlap the first protruded portion 116 of the groove 930. The third sub-conductive patterns may extend from the top open portion of the first sub-conductive pattern in the second direction D2. The fourth sub-conductive patterns may connect the bottom open portion of the first sub-conductive pattern and the bottom open portion of the second sub-conductive pattern. In an example embodiment, the first sub-conductive pattern, the second sub-conductive pattern, the third sub-conductive patterns, and the fourth sub-conductive pattern may be integrally formed at a same layer.

In an example embodiment, as illustrated in FIG. 23, the OLED device 500 may include a first conductive pattern 400 and a second conductive pattern 600. The first conductive pattern 400 on the groove 930 may be disposed along a profile of the second protruded portion 117 of the groove 930, and the second conductive pattern 600 on the groove 930 may be disposed along a profile of the first protruded portion 116 of the groove 930. Thus, the first conductive pattern 400 may substantially surround the second conductive pattern 600. The first conductive pattern 400 may include a first sub-conductive pattern and second sub-conductive patterns. A portion of the first sub-conductive pattern may have a plan shape of a partially opened circle including an open portion, and the second sub-conductive patterns may extend from the open portion of the first sub-conductive pattern in the second direction D2. In an example embodiment, the first sub-conductive pattern and the second sub-conductive patterns may be integrally formed at a same layer. In addition, the second conductive pattern 600 may include a third sub-conductive pattern and fourth sub-conductive patterns. A portion of the third sub-conductive pattern may have a plan shape of a partially opened circle including an open portion, and the fourth sub-conductive patterns may extend from the open portion of the first sub-conductive pattern in the second direction D2. In an example embodiment, the third sub-conductive pattern and the fourth sub-conductive patterns may be integrally formed at a same layer.

The OLED device 500 in accordance with an example embodiment may include the conductive pattern 1400, the pad electrodes 470, and the connection wiring 370. Thus, the OLED device 500 may check whether the first and second protruded portions 116 and 117 is damaged. Accordingly, a defect ratio of the OLED device 500 may be reduced by the OLED device 500 checking whether the first and second protruded portions 116 and 117 is damaged.

Figure 25:
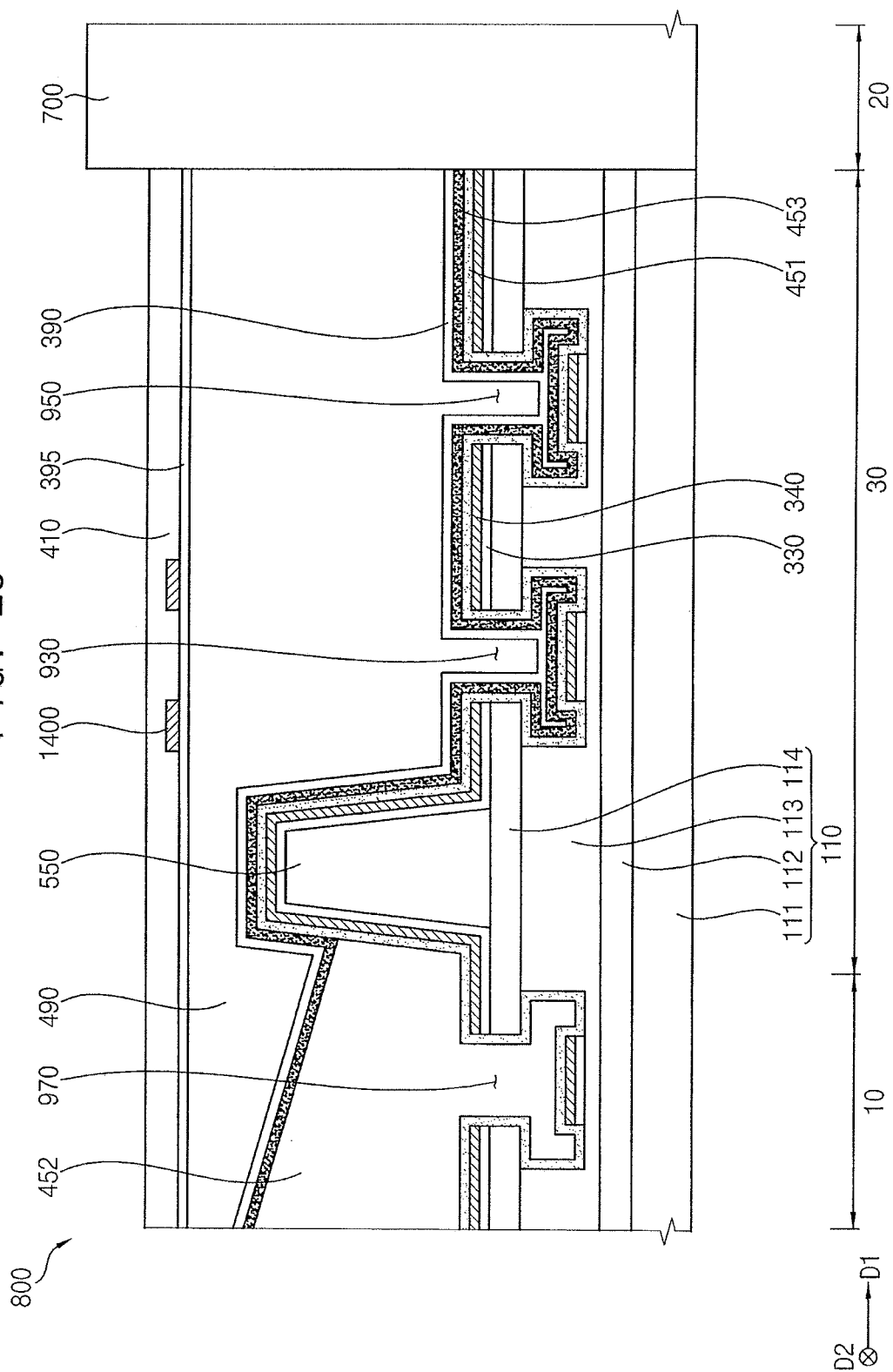
FIG. 25 illustrates a cross-sectional view of an OLED device in accordance with an example embodiment.

FIG. 25 is a cross-sectional view illustrating an OLED device in accordance with an example embodiment. An OLED device 800 illustrated in FIG. 25 may have a configuration substantially the same as or similar to that of an OLED device 500 described with reference to FIGS. 21 through 24 except for a second groove 950 and a third groove 970. In FIG. 25, detailed descriptions for elements that are substantially the same as or similar to elements described with reference to FIGS. 21 through 24 may not be repeated.

Referring to FIG. 25, the OLED device 800 may include a substrate 110, a semiconductor element 250, a planarization layer 270, a light emitting structure 200, a pixel defining layer 310, a TFE structure 450, a touch screen structure 380, an organic insulation pattern 490, a conductive pattern 400, a functional module 700, a block structure 550, etc. The substrate 110 may include a first organic film layer 111, a first barrier layer 112, a second organic film layer 113, and a second barrier layer 114. As the OLED device 800 has the display region 10, the opening region 20, the peripheral region 30, and the pad region 40, the substrate 110 may be divided into the display region 10, the opening region 20, the peripheral region 30, and the pad region 40. In addition, the light emitting structure 200 may include a lower electrode 290, a light emitting layer 330, and an upper electrode 340, and the TFE structure 450 may include a first TFE layer 451, a second TFE layer 452, and a third TFE layer 453. Further, the touch screen structure 380 may include a first insulation layer 390, a plurality of first touch screen electrodes 382, a plurality of second touch screen electrodes 384, a plurality of touch screen connection electrodes 386, a second insulation layer 395, and a protective insulation layer 410.

First, second, and third grooves 930, 950, and 970 having enlarged lower portion may be formed. For example, in the substrate 110, the first groove 930 may be formed in the peripheral region 30, and the second the second groove 950 may be formed between the first groove 930 and the functional module 700. The third groove 970 may be formed in the display region 10. In addition, the second groove 950 may surround the functional module 700, and the first groove 930 may surround the second groove 950. The third groove 970 may surround the first groove 930. In another implementation, at least one groove having an enlarged lower portion may be further formed between the second groove 950 and the functional module 700 and between the third groove 970 and the first groove 930.

The OLED device 800 in accordance with an example embodiment may include the first through third grooves 930, 950, and 970. Thus, the light emitting layer 330 and the upper electrode 340 may be readily separated due to the relatively large number of grooves having the enlarged lower portion. In addition, as the relatively large number of grooves having the enlarged lower portion are in the peripheral region 30, the amount of an impact may be reduced by the relatively large number of grooves having the enlarged lower portion, when an external impact or a stress in a manufacturing process is transmitted to the substrate 110 in a direction from the opening region 20 into the display region 10. Further, as the relatively large number of grooves having the enlarged lower portion are in the peripheral region 30, a contact area of the first TFE layer 451 and the substrate 110 may be relatively increased in the peripheral region 30. Accordingly, the OLED device 800 may help prevent the first TFE layer 451 from being separated from the substrate 110.

The block structure 550 may be between the first groove 930 and the third groove 970 on the substrate 110 located in the peripheral region 30. In an example embodiment, the block structure 550 may block a leakage of the second TFE layer 452. The block structure 550 may include organic materials or inorganic materials. In an example embodiment, the block structure 550 may include organic materials.

The light emitting layer 330 may be on the pixel defining layer 310 and the lower electrode 290 in the display region 10 and extend in the first direction DE and may be in the peripheral region 30 on the substrate 110 and the block structure 550. In an example embodiment, the light emitting layer 330 may be partially in an inner portion of the first through third grooves 930, 950, and 970 each, and the light emitting layer 330 in a portion where each of the first through third grooves 930, 950, and 970 is located may be separated in a depth direction. Thus, the light emitting layer 330 may be separated in the first through third grooves 930, 950, and 970. Thus, the light emitting layer 330 may be separated in the peripheral region 30 by the first and second spaces 118 and 119.

The upper electrode 340 may be on the light emitting layer 330. The upper electrode 340 may overlap the light emitting layer 330 in the display region 10 and may extend in the first direction DE and may be in the peripheral region 30 on the light emitting layer 330. In an example embodiment, the upper electrode 340 may be partially in the inner portion of the first through third grooves 930, 950, and 970 each, and the upper electrode 340 in a portion where each of the first through third grooves 930, 950, and 970 is located may be separated in the depth direction. Thus, the upper electrode 340 may be separated in each of the first through third grooves 930, 950, and 970.

The first TFE layer 451 may be in the display region 10 and the peripheral region 30 on the upper electrode 340. The first TFE layer 451 may cover the upper electrode 340 in the display region 10, and may be disposed with a substantially uniform thickness along a profile of the upper electrode 340 and may extend in the peripheral region 30. The first TFE layer 451 may be disposed along a profile of the upper electrode 340 in the peripheral region 30. Thus, the first TFE layer 451 may be continuously disposed in a portion where each of the first through third grooves 930, 950, and 970 is formed. In an example embodiment, the first TFE layer 451 may completely cover each of the first through third grooves 930, 950, and 970. Thus, the first TFE layer 451 may completely cover the light emitting layer 330 and the upper electrode 340 that are disposed inside each of the first through third grooves 930, 950, and 970. Thus, the first TFE layer 451 may be in direct contact with the second organic film layer 113 in the first and second spaces 118 and 119.

The second TFE layer 452 may be in the display region 10 and a portion of the peripheral region 30 on the first TFE layer 451. In an example embodiment, the second TFE layer 452 may fill an inner portion of the third groove 970, and may not be disposed inside the first groove 930 and the second groove 950.

The third TFE layer 453 may be in the display region 10 on the second TFE layer 452 and in the peripheral region 30 on the first TFE layer 451. The third TFE layer 453 may cover the second TFE layer 452 in the display region 10, and may be disposed with a substantially uniform thickness along a profile of the second TFE layer 452 and may extend in the peripheral region 30. The third TFE layer 453 may be disposed with a substantially uniform thickness along a profile of the first TFE layer 451 in the peripheral region 30. Thus, the third TFE layer 453 may be continuously formed in a portion where the second groove 950 and the third groove 970 each are formed.

The first insulation layer 390 may be in the display region 10 and the peripheral region 30 on the third TFE layer 453. The first insulation layer 390 may cover the third TFE layer 453 in the display region 10, and may be disposed with a substantially uniform thickness along a profile of the third TFE layer 453 and may extend in the peripheral region 30. The first insulation layer 390 may be disposed with a substantially uniform thickness along a profile of the third TFE layer 453 in the peripheral region 30. Thus, the first insulation layer 390 may be continuously disposed in a portion where the second groove 950 and the third groove 970 each are formed.

The organic insulation pattern 490 may be in the peripheral region 30 on the first insulation layer 390. The organic insulation pattern 490 may be disposed with a relatively high thickness in the peripheral region 30 and a portion of the display region 10 on the first insulation layer 390. In this case, the organic insulation pattern 490 may have a substantially flat upper surface.

The conductive pattern 1400 may be in the peripheral region 30 on the second insulation layer 395. In an example embodiment, to detect a damage of the first protruded portion 116 and the second protruded portion 117, the conductive pattern 1400 may overlap the first and second protruded portions 116 and 117 of the first groove 930. For example, the conductive pattern 1400 on the first groove 930 may be disposed along a profile of each of the first and second protruded portions 116 and 117 of the first groove 930.

In an example embodiment, conductive patterns may be further disposed on a protruded portion of each of the second and third grooves 950 and 970.

Example embodiments may be applied to various display devices including an OLED device. For example, example embodiments may be applied to vehicle-display device, a ship-display device, an aircraft-display device, portable communication devices, display devices for display or for information transfer, a medical-display device, etc.

By way of summation and review, a display device such as an OLED device may have a display region where an image is displayed and a non-display region in which gate drivers, data drivers, wirings, and functional modules (e.g., a camera module, a motion recognition sensor, etc.) are disposed. Blocking patterns (for blocking penetration of water, moisture, etc., into a portion of the display region adjacent to the functional module) may be formed adjacent to a functional module. Blocking patterns may be susceptible to damage from external impact or a stress in a manufacturing process, in which case a defect of a display pixel may occur.

As described above, example embodiments relate to an organic light emitting display device that may include a functional module in a portion of a display region. An OLED device according to an example embodiment may include a conductive pattern, pad electrodes, and connection wiring, and the OLED device may check whether the second protruded portion is damaged. Accordingly, as the OLED device checks whether the second protruded portion is damaged, a defect ratio of the OLED device may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of example embodiments as set forth in the following claims.

What is claimed is:

1. An organic light emitting display ("OLED") device, comprising:
   a substrate having an opening region, a peripheral region surrounding the opening region, and a display region surrounding the peripheral region, the substrate including a first groove, which has an enlarged lower portion, formed in the peripheral region and an opening formed in the opening region;
   a light emitting structure in the display region on the substrate;
   a first conductive pattern overlapping the first groove in the peripheral region on the substrate; and
   a functional module in the opening of the substrate, wherein
   the substrate includes:
      a first organic film layer;
      a first barrier layer on the first organic film layer;
      a second organic film layer on the first barrier layer, the second organic film layer having a trench in the peripheral region; and
      a second barrier layer on the second organic film layer, the second barrier layer being located on the trench and having a protruded portion that protrudes in an inner portion of the trench, the second barrier layer having an opening defined by the protruded portion, and
      wherein the first conductive pattern overlaps the protruded portion of the second barrier layer.

2. The OLED device as claimed in claim 1, wherein the first conductive pattern includes:
   a first sub-conductive pattern overlapping the first groove, the first sub-conductive pattern having a plan shape of a partially opened circle including an open portion; and
   second sub-conductive patterns extending from the open portion of the first sub-conductive pattern in an outward direction.

3. The OLED device as claimed in claim 2, further comprising:
   pad electrodes on the substrate, the pad electrodes being electrically connected to an external device; and
   signal wirings, which are located on the substrate, disposed along an outer portion of the substrate, the signal wirings electrically connecting the second sub-conductive patterns and the pad electrodes.

4. The OLED device as claimed in claim 1, wherein the first groove surrounds the opening on the substrate.

5. The OLED device as claimed in claim 4, wherein the first groove has a plan shape of a circle.

6. The OLED device as claimed in claim 1, wherein the first conductive pattern, which is located on the first groove, is disposed along a profile of an outer portion of the first groove.

7. The OLED device as claimed in claim 1, wherein the protruded portion of the second barrier layer includes:
   a first protruded portion located adjacent to the opening of the substrate; and
   a second protruded portion facing the first protruded portion, the second protruded portion being spaced apart from the first protruded portion in a direction from the opening region into the peripheral region.

8. The OLED device as claimed in claim 7, further comprising:
   a second conductive pattern, which is on the first protruded portion, overlapping the first protruded portion, wherein the first conductive pattern is overlapped on the second protruded portion.

9. The OLED device as claimed in claim 8, wherein the first conductive pattern and the second conductive pattern are connected to each other in a region of the peripheral region, and are integrally formed.

10. The OLED device as claimed in claim 1, wherein the trench of the second organic film layer, the protruded portion of the second barrier layer, and the opening of the second barrier layer are defined as the first groove having the enlarged lower portion.

11. The OLED device as claimed in claim 1, wherein the light emitting structure includes:
    a lower electrode;
    a light emitting layer on the lower electrode; and
    an upper electrode on the light emitting layer.

12. The OLED device as claimed in claim 11, wherein the light emitting layer extends in a direction from the display region into the peripheral region on the substrate, and is separated in a portion where the first groove is formed.

13. The OLED device as claimed in claim 11, wherein the upper electrode extends in a direction from the display region into the peripheral region on the substrate, and is separated in a portion where the first groove is formed.

14. The OLED device as claimed in claim 11, wherein the light emitting layer and the upper electrode are in at least a portion of an inner portion of the first groove.

15. The OLED device as claimed in claim 11, further comprising:
    a thin film encapsulation structure on the light emitting structure; and
    a touch screen structure in the display region on the thin film encapsulation structure.

16. The OLED device as claimed in claim 15, wherein the thin film encapsulation structure includes:
    a first thin film encapsulation layer on the upper electrode, the first thin film encapsulation layer including inorganic materials that have flexibility;
    a second thin film encapsulation layer on the first thin film encapsulation layer, the second thin film encapsulation layer including organic materials that have flexibility; and
    a third thin film encapsulation layer on the second thin film encapsulation layer, the third thin film encapsulation layer including inorganic materials that have flexibility.

17. The OLED device as claimed in claim 16, wherein each of the first thin film encapsulation layer and the third thin film encapsulation layer extends in a direction from the display region into the peripheral region on the upper electrode, and is continuously in a portion where the first groove is formed.

18. The OLED device as claimed in claim 16, wherein the touch screen structure includes:
    a first insulation layer in the display region on the third thin film encapsulation layer;
    a touch screen electrode on the first insulation layer;
    a second insulation layer on the touch screen electrode;
    a touch screen connection electrode on the second insulation layer; and
    a protective insulation layer on the touch screen connection electrode.

19. The OLED device as claimed in claim 18, wherein the first insulation layer extends in a direction from the display region into the peripheral region on the third thin film encapsulation layer, and is continuously in a portion where the first groove is formed.

20. The OLED device as claimed in claim 18, further comprising an organic insulation pattern in the peripheral region on the first insulation layer.

21. The OLED device as claimed in claim 20, wherein the second insulation layer is in contact with an upper surface of the first insulation layer in the display region, and is in contact with an upper surface of the organic insulation pattern in the peripheral region.

22. The OLED device as claimed in claim 21, wherein the first conductive pattern is between the second insulation layer and the protective insulation layer.

23. The OLED device as claimed in claim 20, wherein the functional module is in contact with a side surface of the substrate, a side surface of the light emitting layer, a side surface of the upper electrode, a side surface of the first thin film encapsulation layer, a side surface of the third thin film encapsulation layer, a side surface of the first insulation layer, a side surface of the organic insulation pattern, a side surface of the second insulation layer, and a side surface of the protective insulation layer in a boundary of the peripheral region and the opening region.

24. The OLED device as claimed in claim 1, wherein:
the substrate further includes at least one second groove, which has an enlarged lower portion, between the first groove and the functional module, and
the first groove surrounds the second groove.

25. The OLED device as claimed in claim 1, wherein
the substrate further includes at least one third groove surrounding the first groove.

26. The OLED device as claimed in claim 25, further comprising a block structure between the first groove and the third groove in the peripheral region on the substrate, the block structure surrounding the first groove.

* * * * *